(12) United States Patent
Kwak et al.

(10) Patent No.: US 12,664,929 B2
(45) Date of Patent: Jun. 23, 2026

(54) DISPLAY DEVICE

(71) Applicant: Samsung Display Co., Ltd., Yongin-Si (KR)

(72) Inventors: Jin Seon Kwak, Yongin-si (KR); Kyung Bae Kim, Yongin-si (KR); Yong Hee Lee, Yongin-si (KR); Ji Hye Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/426,347

(22) Filed: Jan. 30, 2024

(65) Prior Publication Data

US 2025/0029543 A1     Jan. 23, 2025

(30) Foreign Application Priority Data

Jul. 17, 2023     (KR) ........................ 10-2023-0092558

(51) Int. Cl.
| | |
|---|---|
| *G09G 3/32* | (2016.01) |
| *G09G 3/3208* | (2016.01) |
| *G09G 3/3233* | (2016.01) |
| *H10K 59/121* | (2023.01) |
| *H10K 59/131* | (2023.01) |

(52) U.S. Cl.
CPC ............. *G09G 3/32* (2013.01); *G09G 3/3208* (2013.01); *G09G 3/3233* (2013.01);
(Continued)

(58) Field of Classification Search
CPC ................... G09G 3/32; G09G 3/3208; G09G 2300/0426; G09G 2300/0819; G09G 2300/0852; G09G 2310/08; G09G 2330/08; G09G 3/3233; G09G 2330/10; G09G 3/3266; H10K 59/131; H10K 59/88;
(Continued)

(56) References Cited

U.S. PATENT DOCUMENTS

| | | |
|---|---|---|
| 10,276,078 B2 | 4/2019 | Lee et al. |
| 11,355,395 B2 | 6/2022 | Kao et al. |

(Continued)

FOREIGN PATENT DOCUMENTS

| | | |
|---|---|---|
| KR | 10-2016-0080868 A | 7/2016 |
| KR | 10-2022-0009249 A | 1/2022 |

(Continued)

*Primary Examiner* — Julie Anne Watko
(74) *Attorney, Agent, or Firm* — Innovation Counsel LLP

(57) ABSTRACT

The present disclosure relates to a display device, and more particularly to a display device capable of repairing a transistor. According to an embodiment of the disclosure, a display device comprising: a pixel comprising a light emitting element and a pixel circuit; and a signal line connected to the pixel, wherein the pixel circuit comprises: a first main transistor connected between a driving voltage line and an anode electrode of the light emitting element; a second main transistor connected between a data line and a gate electrode of the first main transistor; a third main transistor connected between the driving voltage line and a source electrode of the first main transistor; a fourth main transistor connected between a drain electrode of the first main transistor and a common voltage line; and one auxiliary transistor disposed adjacent to at least one of the first to fourth main transistors.

46 Claims, 27 Drawing Sheets

(52) U.S. Cl.
CPC ... *H10K 59/131* (2023.02); *G09G 2300/0426* (2013.01); *G09G 2300/0819* (2013.01); *G09G 2300/0852* (2013.01); *G09G 2310/08* (2013.01); *G09G 2330/08* (2013.01); *G09G 2330/10* (2013.01); *H10K 59/1213* (2023.02)

(58) Field of Classification Search
CPC ............. H10K 71/861; H10K 59/1213; H10K 59/1216; H10K 59/805
See application file for complete search history.

(56) References Cited

U.S. PATENT DOCUMENTS

| | | | |
|---|---|---|---|
| 12,067,913 B2* | 8/2024 | Park | G09G 3/3233 |
| 2014/0346475 A1* | 11/2014 | Cho | G09G 3/3225 |
| | | | 438/4 |
| 2015/0130787 A1* | 5/2015 | Chung | G09G 3/3225 |
| | | | 345/76 |
| 2016/0035279 A1* | 2/2016 | Park | G09G 3/3233 |
| | | | 345/212 |
| 2022/0020812 A1 | 1/2022 | Kwon et al. | |
| 2022/0199742 A1* | 6/2022 | Jeon | H01L 27/124 |
| 2024/0357885 A1 | 10/2024 | Lee et al. | |
| 2025/0120259 A1 | 4/2025 | Hong et al. | |

FOREIGN PATENT DOCUMENTS

| | | |
|---|---|---|
| KR | 10-2024-0155397 A | 10/2024 |
| KR | 10-2025-0050192 A | 4/2025 |

* cited by examiner

OA5

BE — VDLb
PCE — RSP
OA4 — DL
VSL — RSP
W1 — SCE4 — W3-A
CT2 — CT26
SCE1 — S3-A
S1 — CT25
CT13 — GCE3
OA6 — G3-A
G1 — AT3
MT1 — SDCE2
CT12 — RSP
CT1 — CT27
GCE1 — D3-A
PCE — DCE5
VDLa — GEE2
D1 — CT28
CT14 — CA3
SDCE1 — CT8 — W3
S4 — S3
CT3 — CT7
CT15 — EML
MT4 — MT3
GL2 — G3
CT10 — CA4
CT16 — D3
G4 — DCE3
CT18 — CT9
DCE4 — CT17
D4 — CT5
CT11 — SCE2
GDCE — RSP — S2
SEE — CT20
SCE3 — G2
CT23 — CT19
S2-A — MT2
GCE2 — CT22
AT2 — CT21
G2-A — CT4
GEE1 — D2
GL1 — DCE2
RSP — CT6
D2-A — DL
DCE1 — VDLb
VSL

DR2
↑
⊙→ DR1
DR3

W2-A  CT24  RSP  GDCE  W2

DISPLAY DEVICE

CROSS-REFERENCE TO RELATED APPLICATION

This application claims priority to Korean Patent Application No. 10-2023-0092558 filed on Jul. 17, 2023, in the Korean Intellectual Property Office, and all the benefits accruing therefrom under 35 U.S.C. 119, the contents of which in its entirety are herein incorporated by reference.

BACKGROUND

1. Technical Field

The present disclosure relates to a display device, and more particularly to a display device capable of repairing a transistor.

2. Description of the Related Art

An organic light emitting display device includes a display element of which luminance is changed by current, for example, an organic light emitting diode.

SUMMARY

Aspects of the present disclosure provide a display device capable of repairing a transistor.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an embodiment of the disclosure, a display device comprising: a pixel comprising a light emitting element and a pixel circuit connected to the light emitting element; and a signal line connected to the pixel, wherein the signal line comprises a gate line, an emission line, and a data line, the pixel circuit comprises: a first main transistor connected between a driving voltage line and an anode electrode of the light emitting element; a second main transistor connected between the data line and a gate electrode of the first main transistor; a third main transistor connected between the driving voltage line and a source electrode of the first main transistor; a fourth main transistor connected between a drain electrode of the first main transistor and a common voltage line; and at least one auxiliary transistor disposed adjacent to at least one of the first to fourth main transistors. A gate electrode, a source electrode and a drain electrode of the at least one auxiliary transistor have a floating state.

In an embodiment, the at least one auxiliary transistor is disposed adjacent to the corresponding main transistor.

In an embodiment, the at least one auxiliary transistor includes a second auxiliary transistor disposed adjacent to the second main transistor and a third auxiliary transistor disposed adjacent to the third main transistor.

In an embodiment, the at least one auxiliary transistor is connected to at least one of the first to fourth main transistors.

In an embodiment, when the at least one auxiliary transistor is connected to at least one of the first to fourth main transistors, a source electrode and a drain electrode of the main transistor corresponding to the at least one auxiliary transistor have a floating state.

In an embodiment, a gate electrode of the main transistor corresponding to the at least one auxiliary transistor is connected to one of a node of the pixel circuit and the signal line.

In an embodiment, further comprising: a gate connection electrode connected to a gate electrode of the at least one auxiliary transistor; and a gate extension electrode disposed on a different layer from the gate connection electrode, and connected to the gate connection electrode, wherein a repair short portion of the gate extension electrode overlaps a repair short portion of the gate line.

In an embodiment, the gate extension electrode is disposed over the gate connection electrode and the gate line.

In an embodiment, the repair short portion of the gate extension electrode and the repair short portion of the gate line are in contact with each other.

In an embodiment, a gate electrode of the main transistor corresponding to the at least one auxiliary transistor is connected to the gate line.

In an embodiment, further comprising: a first source connection electrode connected to a source electrode of the at least one auxiliary transistor; and a source extension electrode disposed on a different layer from the first source connection electrode, and connected to the first source connection electrode, wherein a repair short portion of the source extension electrode overlaps a repair short portion of a second source connection electrode connected to the data line.

In an embodiment, the source extension electrode is disposed over the first and second source connection electrodes, and is disposed on the same layer as the data line.

In an embodiment, the repair short portion of the source extension electrode is in contact with the repair short portion of the second source connection electrode.

In an embodiment, wherein a source electrode of the main transistor corresponding to the at least one auxiliary transistor is connected to the second source connection electrode.

In an embodiment, the second source connection electrode is disconnected such that the data line and the source electrode of the main transistor are separated.

In an embodiment, the disconnected portion of the second source connection electrode does not overlap an overlapping portion between the repair short portion of the source extension electrode and the repair short portion of the second source connection electrode.

In an embodiment, further comprising: a drain connection electrode connected to a drain electrode of the at least one auxiliary transistor; and a gate/drain connection electrode disposed on a different layer from the drain connection electrode, herein a repair short portion of the gate/drain connection electrode overlaps a repair short portion of the drain connection electrode.

In an embodiment, the gate/drain connection electrode is disposed over the drain connection electrode.

In an embodiment, the repair short portion of the gate/drain connection electrode and the repair short portion of the drain connection electrode are in contact with each other.

In an embodiment, a drain electrode of the main transistor corresponding to the at least one auxiliary transistor is connected to the gate/drain connection electrode.

In an embodiment, the drain connection electrode is disconnected such that the gate/drain connection electrode and the drain electrode of the main transistor are separated.

In an embodiment, the disconnected portion of the drain connection electrode does not overlap an overlapping portion between the repair short portion of the gate/drain connection electrode and the repair short portion of the drain connection electrode.

In an embodiment, further comprising: a gate connection electrode connected to a gate electrode of the at least one auxiliary transistor; and a gate extension electrode disposed on a different layer from the gate connection electrode and connected to the emission line, wherein a repair short portion of the gate extension electrode overlaps a repair short portion of the gate connection electrode.

In an embodiment, the gate extension electrode is disposed over the gate connection electrode and the gate line.

In an embodiment, the repair short portion of the gate extension electrode and the repair short portion of the gate connection electrode are in contact with each other.

In an embodiment, a gate electrode of the main transistor corresponding to the at least one auxiliary transistor is connected to the emission line.

In an embodiment, further comprising a source connection electrode connected to a source electrode of the at least one auxiliary transistor, wherein the driving voltage line comprises a lower driving voltage line and an upper driving voltage line connected to each other, the upper driving voltage line is disposed on a different layer from the source connection electrode, and a repair short portion of the upper driving voltage line overlaps a repair short portion of the source connection electrode.

In an embodiment, the upper driving voltage line is disposed over the source connection electrode.

In an embodiment, the repair short portion of the upper driving voltage line and the repair short portion of the source connection electrode are in contact with each other. In an embodiment, a source electrode of the main transistor corresponding to the at least one auxiliary transistor is connected to the lower driving voltage line.

In an embodiment, the lower driving voltage line is disconnected such that lower driving voltage line and the source electrode of the main transistor are separated.

In an embodiment, the disconnected portion of the lower driving voltage line does not overlap an overlapping portion between the repair short portion of the upper driving voltage line and the repair short portion of the source connection electrode.

In an embodiment, further comprising: a drain connection electrode connected to a drain electrode of the at least one auxiliary transistor; and a source/drain connection electrode disposed on a different layer from the drain connection electrode, wherein a repair short portion of the source/drain connection electrode overlaps a repair short portion of the drain connection electrode.

In an embodiment, the source/drain connection electrode is disposed over the drain connection electrode.

In an embodiment, the repair short portion of the source/drain connection electrode and the repair short portion of the drain connection electrode are in contact with each other.

In an embodiment, a drain electrode of the main transistor corresponding to the at least one auxiliary transistor is connected to the source/drain connection electrode.

In an embodiment, the drain connection electrode is disconnected such that source/drain connection electrode and the drain electrode of the main transistor are separated.

In an embodiment, the disconnected portion of the drain connection electrode does not overlap an overlapping portion between the repair short portion of the source/drain connection electrode and the repair short portion of the drain connection electrode.

In an embodiment, the at least one auxiliary transistor comprises at least one of a second auxiliary transistor corresponding to the second main transistor or a third auxiliary transistor corresponding to the third main transistor.

In an embodiment, the pixel comprises a first-first transistor area, a first-second transistor area, a second-first transistor area, a second-second transistor area, a third-first transistor area, and a third-second transistor area disposed in three rows and two columns.

In an embodiment, the first main transistor is disposed in the first-first transistor area corresponding to a first column of a first row, the second main transistor is disposed in the third-second transistor area corresponding to a second column of a third row, the third main transistor is disposed in the second-second transistor area corresponding to the second column of a second row, the fourth main transistor is disposed in the second-first transistor area corresponding to the first column of the second row, the second auxiliary transistor is disposed in the third-first transistor area corresponding to the first column of the third row, and the third auxiliary transistor is disposed in the first-second transistor area corresponding to the second column of the first row.

In an embodiment, in the pixel, the first main transistor is disposed in the first-second transistor area corresponding to the second column of the first row, the second main transistor is disposed in the third-first transistor area corresponding to the first column of the third row, the third main transistor is disposed in the second-first transistor area corresponding to the first column of the second row, the fourth main transistor is disposed in the second-second transistor area corresponding to the second column of the second row, the second auxiliary transistor is disposed in the third-second transistor area corresponding to the second column of the third row, and the third auxiliary transistor is disposed in the first-first transistor area corresponding to the first column of the first row. In a second pixel disposed adjacent to the pixel, a first main transistor is disposed in a first-second transistor area corresponding to a second column of a first row, a second main transistor is disposed in a third-first transistor area corresponding to a first column of a third row, a third main transistor is disposed in a second-second transistor area corresponding to the second column of a second row, a fourth main transistor is disposed in a second-first transistor area corresponding to the first column of the second row, a second auxiliary transistor is disposed in a third-second transistor area corresponding to the second column of the third row, and a third auxiliary transistor is disposed in a first-first transistor area corresponding to the first column of the first row.

In an embodiment, the first main transistor is disposed in the third-first transistor area corresponding to the first column of the third row, the second main transistor is disposed in the second-first transistor area corresponding to the first column of the second row, the third main transistor is disposed in the second-second transistor area corresponding to the second column of the second row, the fourth main transistor is disposed in the third-second transistor area corresponding to the second column of the third row, the second auxiliary transistor is disposed in the first-first transistor area corresponding to the first column of the first row, and the third auxiliary transistor is disposed in the first-second transistor area corresponding to the second column of the first row.

In an embodiment, the first main transistor is disposed in the first-second transistor area corresponding to the second column of the first row, the second main transistor is disposed in the second-second transistor area corresponding to the second column of the second row, the third main transistor is disposed in the second-first transistor area corresponding to the first column of the second row, the fourth main transistor is disposed in the first-first transistor area corresponding to the first column of the first row, the second auxiliary transistor is disposed in the third-second transistor area corresponding to the second column of the third row, and the third auxiliary transistor is disposed in the third-first transistor area corresponding to the first column of the third row.

In an embodiment, the first main transistor is disposed in the first-first transistor area corresponding to the first column of the first row, the second main transistor is disposed in the first-second transistor area corresponding to the second column of the first row, the third main transistor is disposed in the third-first transistor area corresponding to the first column of the third row, the fourth main transistor is disposed in the third-second transistor area corresponding to the second column of the third row, the second auxiliary transistor is disposed in the second-second transistor area corresponding to the second column of the second row, and the third auxiliary transistor is disposed in the second-first transistor area corresponding to the first column of the second row.

In an embodiment, further comprising: a sensing line connected to the pixel; and a sensing transistor disposed in the pixel circuit, and connected between the sensing line and the gate electrode of the first main transistor.

In an embodiment, the first main transistor is disposed in the first-first transistor area corresponding to the first column of the first row, the second main transistor is disposed in the third-second transistor area corresponding to the second column of the third row, the third main transistor is disposed in the second-second transistor area corresponding to the second column of the second row, the fourth main transistor is disposed in the second-first transistor area corresponding to the first column of the second row, the second auxiliary transistor is disposed in the third-first transistor area corresponding to the first column of the third row, and the sensing transistor is disposed in the first-second transistor area corresponding to the second column of the first row.

In an embodiment, further comprising: first capacitor connected between the gate electrode of the first main transistor and the anode electrode of the light emitting element; and a second capacitor connected between the gate electrode of the first main transistor and the source electrode of the first main transistor.

In accordance with the display device according to the present disclosure, a pixel circuit includes an auxiliary transistor capable of replacing a main transistor. Accordingly, a transistor may be repaired by removing the main transistor that has been determined to be defective from the pixel circuit and then connecting the auxiliary transistor to the pixel circuit.

The effects of the present disclosure are not limited to the aforementioned effects, and various other effects are included in the present specification.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
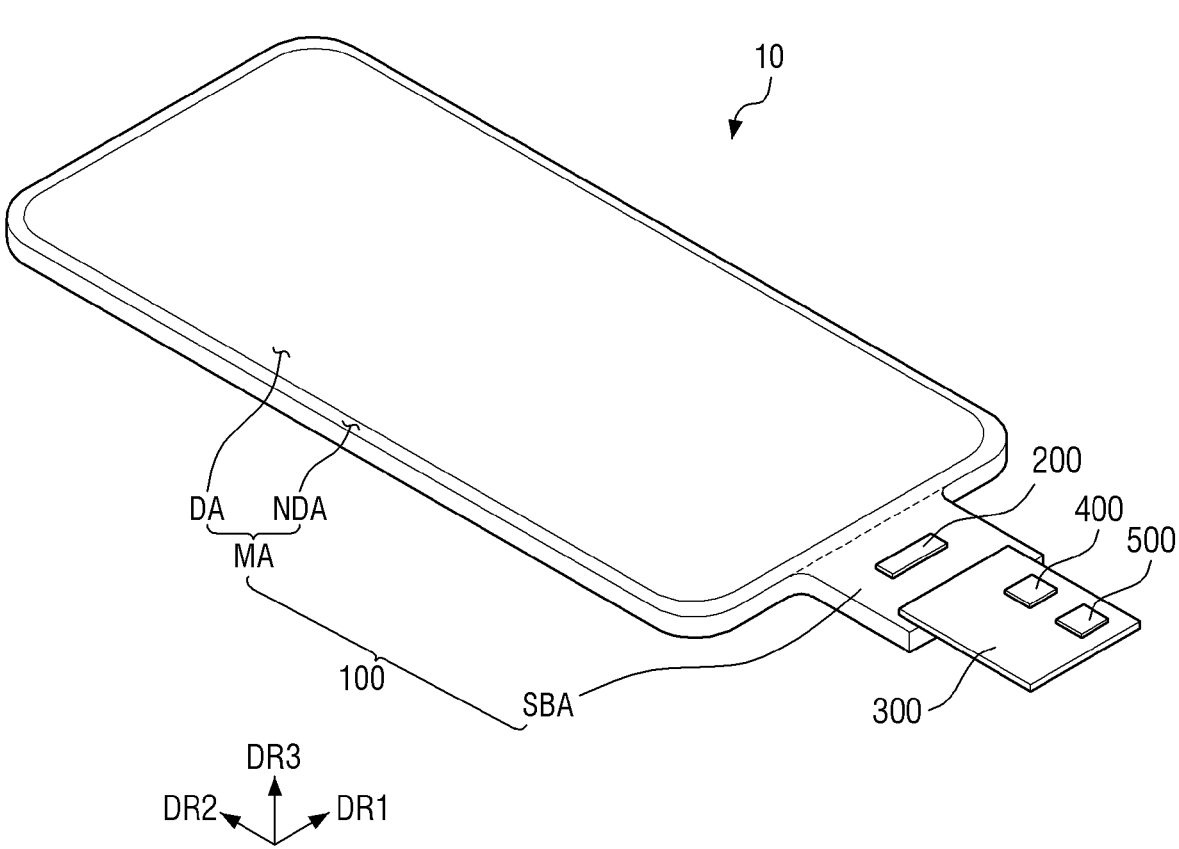
FIG. 1 is a perspective view showing a display device according to one embodiment.

Advantages and features of the present disclosure and methods to achieve them will become apparent from the descriptions of exemplary embodiments hereinbelow with reference to the accompanying drawings. However, the present disclosure is not limited to exemplary embodiments disclosed herein but may be implemented in various different ways. The exemplary embodiments are provided for making the disclosure of the present disclosure thorough and for fully conveying the scope of the present disclosure to those skilled in the art. It is to be noted that the scope of the present disclosure is defined only by the claims.

As used herein, a phrase "an element A on an element B" refers to that the element A may be disposed directly on the element B and/or the element A may be disposed indirectly on the element B via another element C. Like reference numerals denote like elements throughout the descriptions.

The figures, dimensions, ratios, angles, numbers of elements given in the drawings are merely illustrative and are not limiting.

Although terms such as first, second, etc. are used to distinguish arbitrarily between the elements such terms describe, and thus these terms are not necessarily intended to indicate temporal or other prioritization of such elements. These terms are used to merely distinguish one element from another. Accordingly, as used herein, a first element may be a second element within the technical scope of the present disclosure.

Features of various exemplary embodiments of the present disclosure may be combined partially or totally. As will be clearly appreciated by those skilled in the art, technically various interactions and operations are possible. Various exemplary embodiments can be practiced individually or in combination.

Hereinafter, embodiments will be described in detail with reference to the accompanying drawings.

FIG. 1 is a perspective view showing a display device according to one embodiment.

Referring to FIG. 1, a display device 10 may be applied to portable electronic devices such as a mobile phone, a smartphone, a tablet personal computer, a mobile communication terminal, an electronic organizer, an electronic book, a portable multimedia player (PMP), a navigation system, an ultra-mobile PC (UMPC) or the like. For example, the display device 10 may be applied as a display unit of a television, a laptop, a monitor, a billboard, or an Internet-of-Things (IoT) device. For another example, the display device 10 may be applied to wearable devices such as a smart watch, a watch phone, a glasses type display, or a head mounted display (HMD).

The display device 10 may have a planar shape similar to a quadrilateral shape. For example, the display device 10 may have a planar shape similar to a quadrilateral shape having a short side in a first direction DR1 and a long side in a second direction DR2. A corner where the short side in the first direction DR1 and the long side in the second direction DR2 meet may be right-angled or rounded with a predetermined curvature. The planar shape of the display device 10 is not limited to a quadrilateral shape, and may be formed in a shape similar to another polygonal shape, a circular shape, or elliptical shape.

The display device 10 may include a display panel 100, a display driver 200, a circuit board 300, a touch driver 400, and a power supply unit 500.

The display panel 100 may include a main region MA and a sub-region SBA.

The main region MA may include a display area DA including pixels displaying an image and a non-display area NDA disposed around the display area DA. The display area DA may emit light from a plurality of emission areas or a plurality of opening areas. For example, the display panel 100 may include a pixel circuit PC including switching elements, a pixel defining layer defining an emission area or an opening area, and a self-light emitting element LEL.

For example, the self-light emitting element LEL may include at least one of an organic light emitting diode (LED) including an organic light emitting layer, a quantum dot LED including a quantum dot light emitting layer, an inorganic LED including an inorganic semiconductor, or a micro LED, but is not limited thereto.

The non-display area NDA may be an area outside the display area DA. The non-display area NDA may be defined as an edge area of the main region MA of the display panel 100. The non-display area NDA may include a gate driver (not illustrated) that supplies gate signals to the gate lines, and fan-out lines (not illustrated) that connect the display driver 200 to the display area DA.

The sub-region SBA may extend from one side of the main region MA. The sub-region SBA may include a flexible material which can be bent, folded or rolled. For example, when the sub-region SBA is bent, the sub-region SBA may overlap the main region MA in a thickness direction (e.g., a third direction DR3). The sub-region SBA may include the display driver 200 and a pad portion connected to the circuit board 300. Optionally, the sub-region SBA may be omitted, and the display driver 200 and the pad portion may be arranged in the non-display area NDA.

The display driver 200 may output signals and voltages for driving the display panel 100. The display driver 200 may supply data voltages to data lines DL. The display driver 200 may supply a power voltage to the power line and may supply a gate control signal to the gate driver. The display driver 200 may be formed as an integrated circuit (IC) and mounted on the display panel 100 by a chip on glass (COG) method, a chip on plastic (COP) method, or an ultrasonic bonding method. For example, the display driver 200 may be disposed in the sub-region SBA, and may overlap the main region MA in the thickness direction (third direction DR3) by bending of the sub-region SBA. For another example, the display driver 200 may be mounted on the circuit board 300.

The circuit board 300 may be attached to the pad portion of the display panel 100 by using an anisotropic conductive film (ACF). Lead lines of the circuit board 300 may be electrically connected to a pad portion of the display panel 100. The circuit board 300 may be a flexible printed circuit board, a printed circuit board, or a flexible film such as a chip on film.

A touch driver 400 may be mounted on the circuit board 300.

The power supply unit 500 may be disposed on the circuit board 300 to supply a power voltage to the display driver 200 and the display panel 100. The power supply unit 500 may generate a driving voltage to supply it to a driving voltage line VDL, and may generate a common voltage to supply it to a common electrode that is common to the light emitting elements of a plurality of pixels. For example, the driving voltage may be a high potential voltage for driving the light emitting element, and the common voltage may be a low potential voltage for driving the light emitting element.

Figure 2:
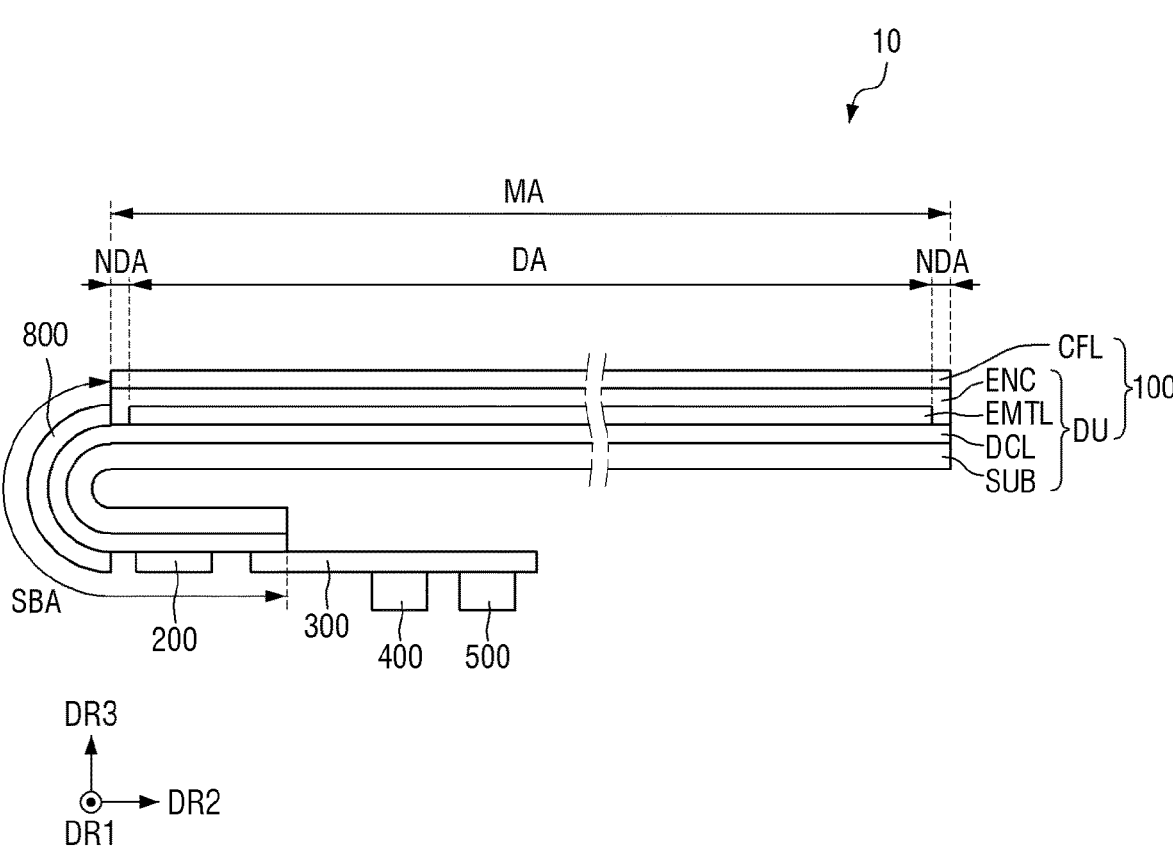
FIG. 2 is a cross-sectional view illustrating a display device according to one embodiment.

FIG. 2 is a cross-sectional view illustrating a display device according to one embodiment.

Referring to FIG. 2, the display panel 100 may include a display unit DU and a color filter layer CFL. The display unit DU may include a substrate SUB, a driving circuit layer DCL, a light emitting element layer EMTL, and an encapsulation layer ENC.

The substrate SUB may be a base substrate SUB or a base member. The substrate SUB may be a flexible substrate SUB which can be bent, folded or rolled. For example, the substrate SUB may include a polymer resin such as polyimide (PI), but is not limited thereto. For another example, the substrate SUB may include a glass material or a metal material.

The driving circuit layer DCL may be disposed on the substrate SUB. The driving circuit layer DCL may include a plurality of transistors. The driving circuit layer DCL may further include the gate lines, the data lines DL, the power lines, gate control lines, the fan-out lines that connect the display driver 200 to the data lines DL, and the lead lines that connect the display driver 200 to the pad portion. Each of the transistors may include a semiconductor region, a source electrode, a drain electrode, and a gate electrode. For example, when the gate driver is formed on one side of the non-display area NDA of the display panel 100, the gate driver may include transistors.

The driving circuit layer DCL may be disposed in the display area DA, the non-display area NDA, and the sub-region SBA. Transistors, gate lines, data lines DL, and power lines of the pixels of the driving circuit layer DCL may be disposed in the display area DA. Gate control lines and fan-out lines of the driving circuit layer DCL may be disposed in the non-display area NDA. The lead lines of the driving circuit layer DCL may be disposed in the sub-region SBA.

The light emitting element layer EMTL may be disposed on the driving circuit layer DCL. The light emitting element layer EMTL may include the plurality of light emitting elements ED in which a pixel electrode, a light emitting layer, and a common electrode are sequentially stacked to emit light, and the pixel defining layer defining the pixels. The plurality of light emitting elements ED of the light emitting element layer EMTL may be disposed in the display area DA.

For example, the light emitting layer may be an organic light emitting layer including an organic material. The light emitting layer may include a hole transporting layer, an organic light emitting layer, and an electron transporting layer. When the pixel electrode receives a predetermined voltage through the transistor of the driving circuit layer DCL and the common electrode receives the cathode voltage, holes and electrons may be transferred to the organic light emitting layer through the hole transporting layer and the electron transporting layer, respectively and may be combined with each other to emit light in the organic light emitting layer. For example, the pixel electrode may be an anode electrode, and the common electrode may be a cathode electrode, but the present disclosure is not limited thereto.

For another example, each of the plurality of light emitting elements ED may include a quantum dot light emitting diode including a quantum dot light emitting layer, an inorganic light emitting diode including an inorganic semiconductor, or a micro light emitting diode.

The encapsulation layer ENC may cover the top surface and the side surface of the light emitting element layer EMTL, and may protect the light emitting element layer EMTL. The encapsulation layer ENC may include at least one inorganic layer and at least one organic layer for encapsulating the light emitting element layer EMTL.

The color filter layer CFL may be disposed on the encapsulation layer ENC. The color filter layer CFL may include a plurality of color filters respectively corresponding to the plurality of emission areas. Each of the color filters may selectively transmit light of a specific wavelength and may block or absorb light of a different wavelength. The color filter layer CFL may absorb a part of light coming from the outside of the display device 10 to reduce reflected light due to external light. Accordingly, the color filter layer CFL may prevent color distortion caused by reflection of the external light.

The sub-region SBA of the display panel 100 may extend from one side of the main region MA. The sub-region SBA may include a flexible material which can be bent, folded or rolled. For example, when the sub-region SBA is bent, the sub-region SBA may overlap the main region MA in a thickness direction (third direction DR3). The sub-region SBA may include the display driver 200 and the pad portion electrically connected to the circuit board 300.

When the sub-region SBA is bent, as shown in FIG. 2, a protective layer 800 may be further disposed on the bent portion of the sub-region SBA.

Figure 3:
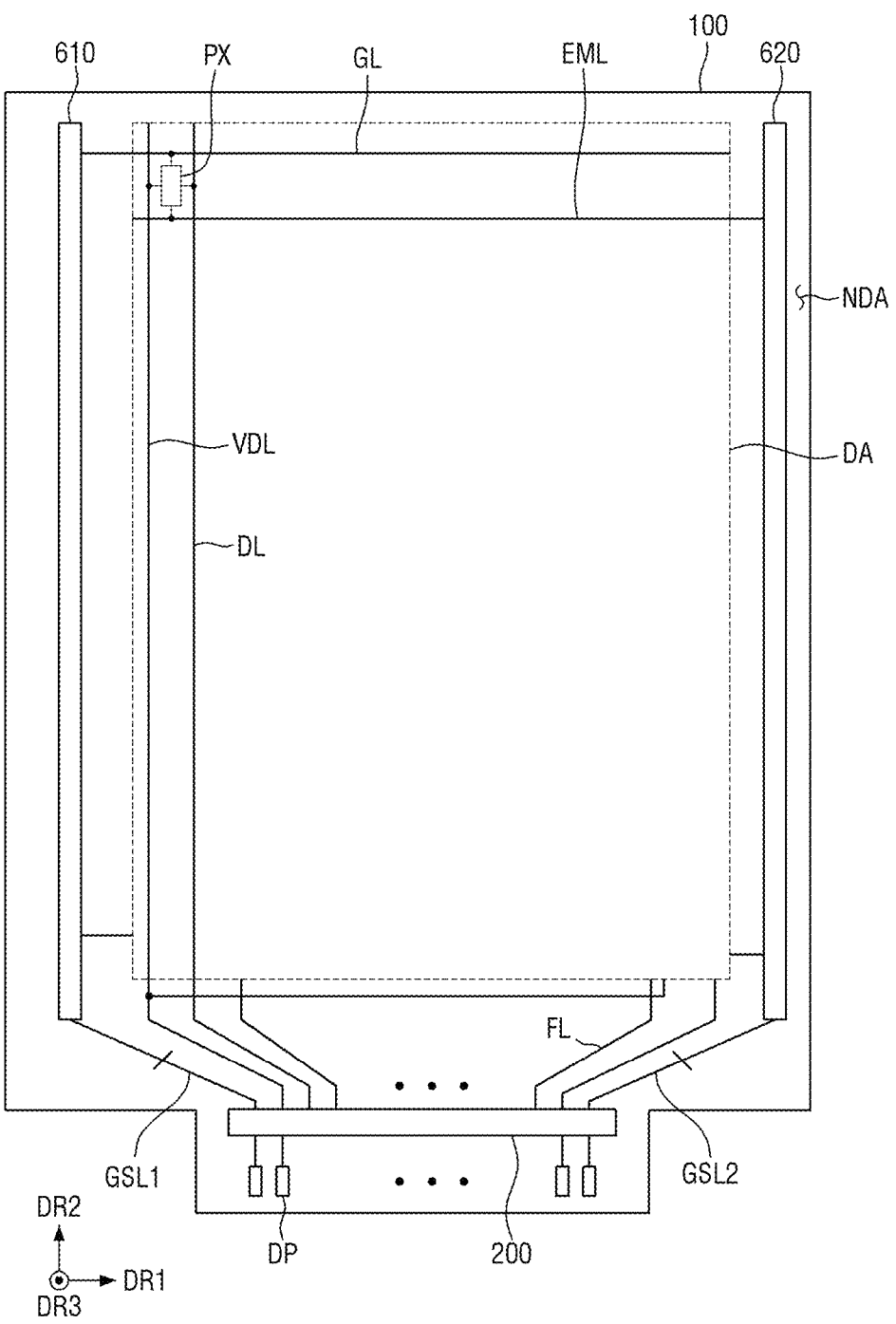
FIG. 3 is a plan view illustrating a display unit of a display device according to one embodiment.
Figure 4:
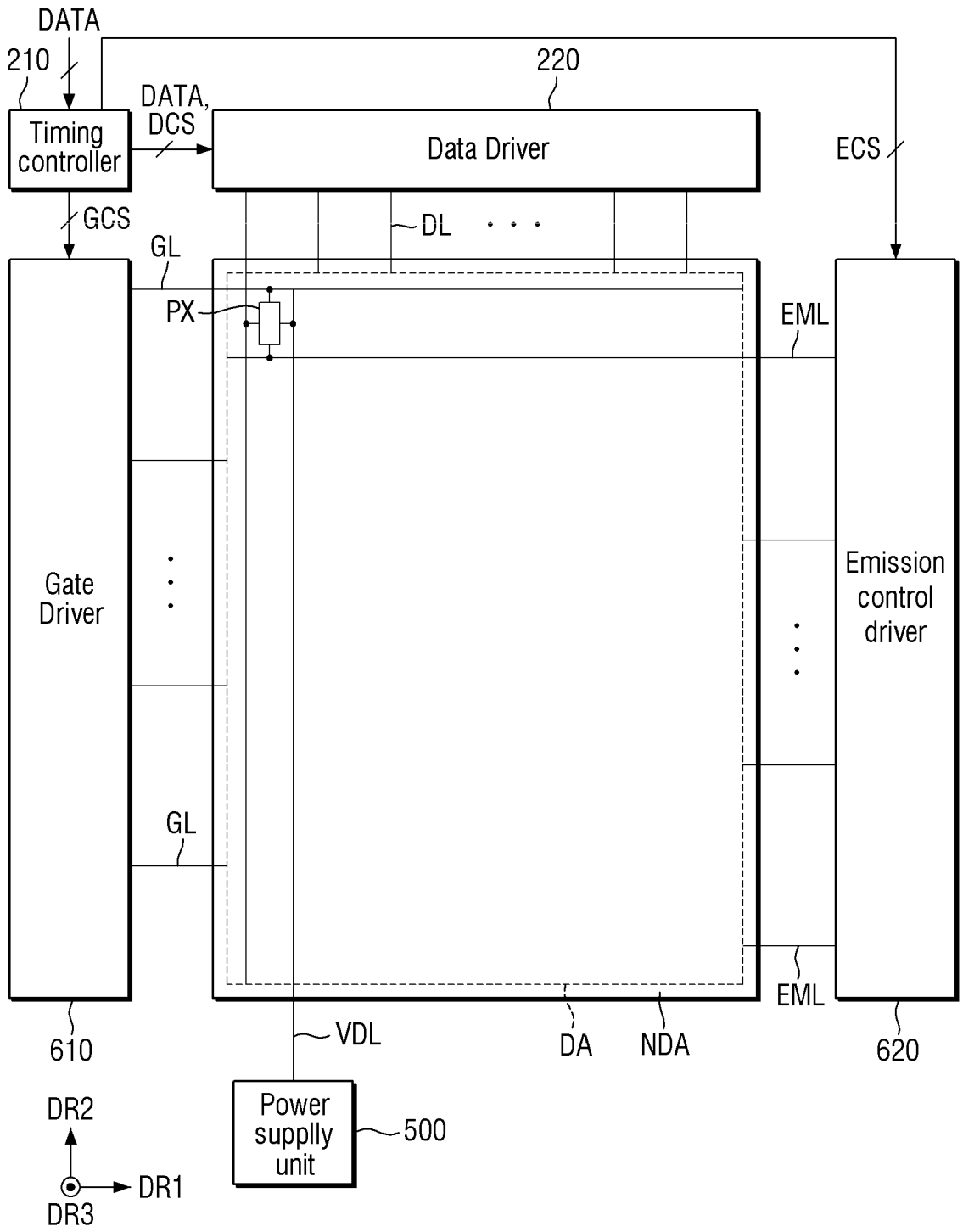
FIG. 4 is a block diagram illustrating a display panel and a display driver according to one embodiment.

FIG. 3 is a plan view illustrating a display unit of a display device according to one embodiment. FIG. 4 is a block diagram illustrating a display panel and a display driver according to one embodiment.

Referring to FIGS. 3 and 4, the display panel 100 may include the display area DA and the non-display area NDA.

The display area DA may include a plurality of pixels PX, and a plurality of signal transmission lines connected to the plurality of pixels PX. Here, the plurality of signal transmission lines may include a plurality of gate lines and a plurality of common voltage lines VSL (see FIG. 5), a plurality of emission lines EML and a plurality of data lines DL, and the fan-out lines connected to the aforementioned lines.

Each of the plurality of pixels PX may be connected to a gate line, a data line DL, an emission line EML, a driving voltage line VDL, and the common voltage line VSL. Each of the pixels PX may include at least one transistor, the light emitting element ED and a capacitor.

Each of the gate lines may extend in the first direction DR1 and may be spaced apart from each other in the second direction DR2 intersecting the first direction DR1. The gate lines may be arranged along the second direction DR2. The gate lines may sequentially supply gate signals to the plurality of pixels PX.

The emission lines EML may each extend in the first direction DR1 and may be spaced apart from each other in the second direction DR2. The emission line EML may be arranged along the second direction DR2. The emission lines EML may sequentially supply an emission signal EM to the plurality of pixels PX.

The data lines DL may extend in the second direction DR2 and may be spaced apart from each other in the first direction DR1. The data lines DL may be arranged along the first direction DR1. The data lines DL may supply data voltages to the plurality of pixels PX. The data voltages may determine the luminance of each of the pixels PX.

The driving voltage lines VDL may extend in the second direction DR2 and may be spaced apart from each other in the first direction DR1. The driving voltage lines VDL may be arranged along the first direction DR1. The driving voltage lines VDL may supply a driving voltage to the plurality of pixels PX. The driving voltage may be a high potential voltage for driving the light emitting element ED of the pixels PX.

The non-display area NDA may surround the display area DA. The non-display area NDA may include a gate driver 610, an emission control driver 620, fan-out lines FL, a first gate control line GSL1, and a second gate control line GSL2.

The fan-out lines FL may extend from the display driver 200 to the display area DA. The fan-out lines FL may supply the data voltages received from the display driver 200 to the plurality of data lines DL.

The first gate control line GSL1 may extend from the display driver 200 to the gate driver 610. The first gate control line GSL1 may supply a gate control signal GCS received from the display driver 200 to the gate driver 610.

The second gate control line GSL2 may extend from the display driver 200 to the emission control driver 620. The second gate control line GSL2 may supply an emission control signal ECS received from the display driver 200 to the emission control driver 620.

The sub-region SBA may extend from one side of the non-display area NDA. The sub-region SBA may include the display driver 200 and a pad portion DP. The pad portion DP may be disposed closer to one edge of the sub-region SBA than the display driver 200. The pad portion DP may be electrically connected to the circuit board 300 through an anisotropic conductive film ACF.

The display driver 200 may include a timing controller 210 and a data driver 220.

The timing controller 210 may receive a digital video data signal DATA and timing signals from the circuit board 300. The timing controller 210 may generate, based on the timing signals, a data control signal DCS to control the operation timing of the data driver 220, the gate control signal GCS to control the operation timing of the gate driver 610, and the emission control signal ECS to control the operation timing of the emission control driver 620. The timing controller 210 may supply the gate control signal GCS to the gate driver 610 through the first gate control line GSL1. The timing controller 210 may supply the emission control signal ECS to the emission control driver 620 through the second gate control line GSL2. The timing controller 210 may supply the digital video data signal DATA and the data control signal DCS to the data driver 220.

The data driver 220 may convert the digital video data signal DATA into analog data voltages and supply them to the data lines DL through the fan-out lines FL. The gate signals of the gate driver 610 may select the pixels PX to which the data voltage is supplied, and the selected pixels PX may receive the data voltages through the data lines DL.

The power supply unit 500 may be disposed on the circuit board 300 to supply a power voltage to the display driver 200 and the display panel 100. The power supply unit 500 may generate a driving voltage to supply it to a driving voltage line VDL, and may generate a common voltage to supply it to a common electrode that is common to the light emitting elements ED of a plurality of pixels.

The gate driver 610 may be disposed at one external side of the display area DA or at one side of the non-display area NDA. The emission control driver 620 may be disposed at the other external side of the display area DA or at the other side of the non-display area NDA. However, the present disclosure is not limited thereto. As another example, the gate driver 610 and the emission control driver 620 may be disposed at any side of the non-display area NDA.

The gate driver 610 may include a plurality of transistors for generating gate signals based on the gate control signal GCS. The emission control driver 620 may include a plurality of transistors that generate the emission signals EM based on the emission control signal ECS. For example, the transistors of the gate driver 610 and the transistors of the emission control driver 620 may be formed on the same layer as the transistors of each of the pixels PX. The gate driver 610 may supply the gate signals to the gate lines, and the emission control driver 620 may supply the emission signals EM to the emission lines EML.

Figure 5:
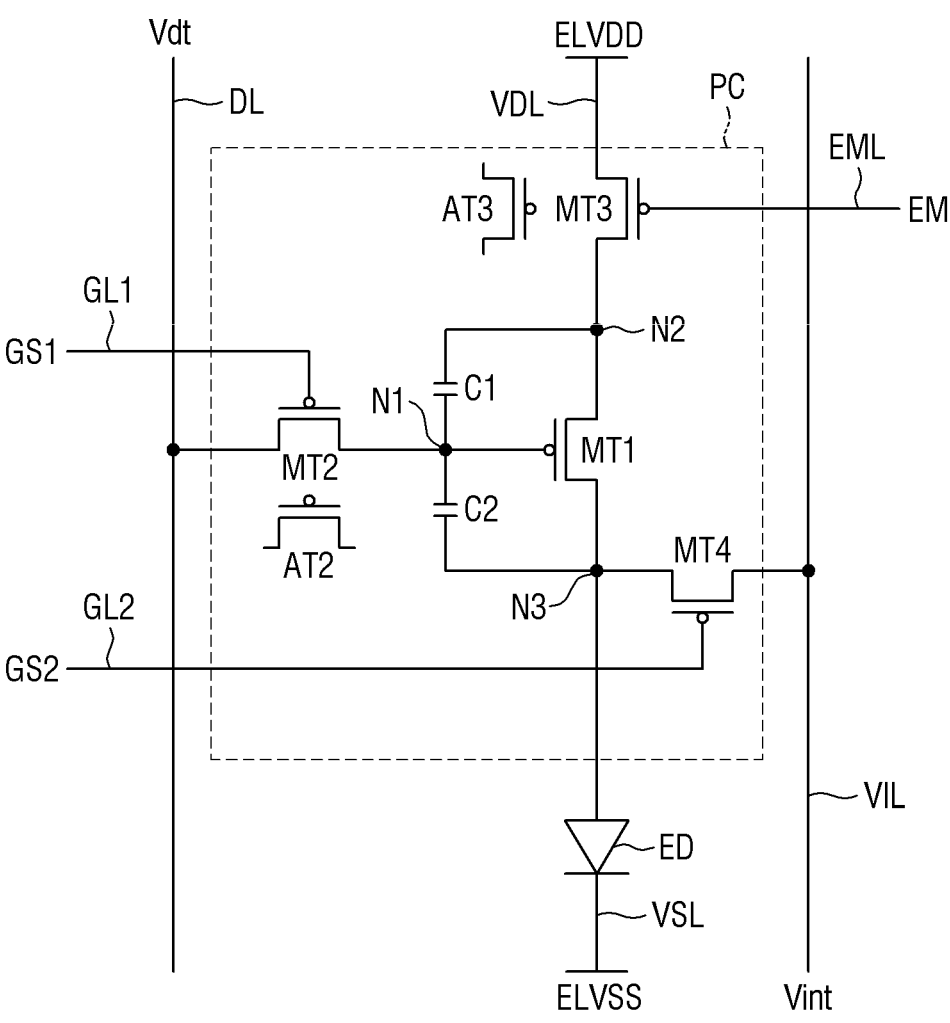
FIG. 5 is a circuit diagram of one pixel of a display device according to one embodiment.

FIG. 5 is a circuit diagram of one pixel of a display device according to one embodiment.

As shown in FIG. 5, the pixel PX may be connected to a first gate line GL1, a second gate line GL2, the emission line EML, an initialization line VIL, the data line DL, the driving voltage line VDL, and the common voltage line VSL. Here, the common voltage line VSL may be connected to the common electrode (e.g., cathode electrode) of the light emitting element ED.

The pixel PX may include a pixel circuit PC and the light emitting element ED.

The pixel circuit PC may include a first main transistor MT1, a second main transistor MT2, a third main transistor MT3, a fourth main transistor MT4, a second auxiliary transistor AT2, a third auxiliary transistor AT3, a first capacitor C1, and a second capacitor C2.

The first main transistor MT1 (for example, a driving transistor) may include a gate electrode, a source electrode, and a drain electrode. The first main transistor MT1 may control a source-drain current (hereinafter, a driving current) according to the data voltage applied to the gate electrode. The driving current (e.g., Isd) flowing through a channel region of the first main transistor MT1 may be proportional to the square of a difference between the threshold voltage Vth and the voltage Vsg between the source electrode and the gate electrode of the first main transistor MT1 ($Isd=k \times (Vsg-Vth)^2$). Here, k is a proportional coefficient determined by the structure and physical characteristics of the first main transistor MT1, Vsg is a source-gate voltage of the first main transistor MT1, and Vth is a threshold voltage of the first main transistor MT1. The gate electrode of the first main transistor MT1 may be connected to a first node N1, the source electrode thereof may be connected to a second node N2, and the drain electrode thereof may be connected to a third node N3.

The light emitting element ED may emit light by receiving the driving current Isd. The emission amount or the luminance of the light emitting element ED may be proportional to the magnitude of the driving current Isd. The light emitting element ED may be an organic light emitting diode including a first electrode, a second electrode, and an organic light emitting layer disposed between the first electrode and the second electrode. For another example, the light emitting element ED may be an inorganic light emitting element including a first electrode, a second electrode, and an inorganic semiconductor disposed between the first electrode and the second electrode. For still another example, the light emitting element ED may be a quantum dot light emitting element including a first electrode, a second electrode, and a quantum dot light emitting layer disposed between the first electrode and the second electrode. For still another example, the light emitting element ED may be a micro light emitting diode. The first electrode of the light emitting element ED may be electrically connected to the third node N3. The second electrode of the light emitting element ED may be connected to the common voltage line VSL. The second electrode of the light emitting element ED may receive a common voltage (e.g., low potential voltage) from the common voltage line VSL.

The second main transistor MT2 may be turned on by a first gate signal GS1 of the first gate line GL1 to electrically connect the data line DL to the first node N1. The gate electrode of the second main transistor MT2 may be electrically connected to the first gate line GL1, the source electrode thereof may be electrically connected to the data line DL, and the drain electrode thereof may be electrically connected to the first node N1. The data line DL may transmit the digital data signal DATA or a reference voltage Vref.

The third main transistor MT3 may be turned on by the emission signal EM of the emission line EML to electrically connect the driving voltage line VDL to the second node N2. The gate electrode of the third main transistor MT3 may be electrically connected to the emission line EML, the source electrode thereof may be electrically connected to the driving voltage line VDL, and the drain electrode thereof may be electrically connected to the second node N2.

The fourth main transistor MT4 may be turned on by a second gate signal GS2 of the second gate line GL2 to electrically connect the third node N3 to the initialization line VIL. The gate electrode of the fourth main transistor MT4 may be electrically connected to the second gate line GL2, the source electrode thereof may be electrically connected to the third node N3, and the drain electrode thereof may be electrically connected to the initialization line VIL. Meanwhile, a plurality of initialization lines VIL may be provided, and the plurality of initialization lines VIL may be connected to each other. For example, the initialization lines VIL may include a plurality of horizontal initialization lines VIL extending along the first direction DR1 and arranged in the second direction DR2 and a plurality of vertical initialization lines VIL extending along the second direction DR2 and arranged along the first direction DR1, and the horizontal initialization lines VIL and the vertical initialization lines VIL may be connected to each other.

The first capacitor C1 may be electrically connected between the first node N1 and the second node N2. For example, the first electrode of the first capacitor C1 may be electrically connected to the first node N1, and the second electrode of the first capacitor C1 may be electrically connected to the second node N2.

The second capacitor C2 may be electrically connected between the first node N1 and the third node N3. For example, the first electrode of the second capacitor C2 may be electrically connected to the first node N1, and the second electrode of the second capacitor C2 may be electrically connected to the third node N3.

When the first main transistor MT1 and the third main transistor MT3 are turned on, the driving current is supplied to the light emitting element ED so that the light emitting element ED may emit light.

At least one of the aforementioned first to fourth main transistors MT1 to MT4 may be a metal-oxide-semiconductor field effect transistor (MOSFET). For example, each of the first to fourth main transistors MT1 to MT4 may be a P-type MOSFET. Meanwhile, for another example, each of the first to fourth main transistors MT1 to MT4 may be an N-type MOSFET. For still another example, at least one of the first to fourth main transistors T1 to T4 may be P-type MOSFETs, and the other transistors may be N-type MOSFETs.

The auxiliary transistor may include transistors having the same configuration as that of at least one of the first to fourth main transistors MT1 to MT4 described above. For example, the auxiliary transistor may include the second auxiliary transistor AT2 and the third auxiliary transistor AT3.

The second auxiliary transistor AT2 may be a transistor capable of replacing the second main transistor MT2 when a defect occurs in the aforementioned second main transistor MT2. The second auxiliary transistor AT2 may have the same configuration as that of the aforementioned second main transistor MT2. The second auxiliary transistor AT2 may be disposed close to the second main transistor MT2.

When no defect occurs in the second main transistor MT2, the second auxiliary transistor AT2 may have a floating state. For example, the gate electrode, the source electrode, and the drain electrode of the second auxiliary transistor AT2 may be maintained in the floating state. Meanwhile, when a defect occurs in the second main transistor MT2, the second main transistor MT2 may be separated from the pixel circuit PC, and the second auxiliary transistor AT2 may be connected to the pixel circuit PC. For example, the connection portion between the gate electrode of the second main transistor MT2 and the first gate line GL1 may be disconnected, the connection portion between the source electrode of the second main transistor MT2 and the data line may be disconnected, and the connection portion between the drain electrode of the second main transistor MT2 and the first node may be disconnected, so that the second main transistor MT2 may be separated from the pixel circuit PC. Further, the gate electrode of the second auxiliary transistor AT2 and the first gate line GL1 may be connected, the source electrode of the second auxiliary transistor AT2 and the data line may be connected, and the drain electrode of the second auxiliary transistor AT2 and the first node may be connected, so that the second auxiliary transistor AT2 may be connected to the pixel circuit PC.

The third auxiliary transistor AT3 may be a transistor capable of replacing the third main transistor MT3 when a defect occurs in the third main transistor MT3 described above. The third auxiliary transistor AT3 may have the same configuration as that of the third main transistor MT3 described above. The third auxiliary transistor AT3 may be disposed close to the third main transistor MT3.

When no defect occurs in the third main transistor MT3, the third auxiliary transistor AT3 may have a floating state. For example, the gate electrode, the source electrode, and the drain electrode of the third auxiliary transistor AT3 may be maintained in the floating state. Meanwhile, when a defect occurs in the third main transistor MT3, the third main transistor MT3 may be separated from the pixel circuit PC, and the third auxiliary transistor AT3 may be connected to the pixel circuit PC. For example, the connection portion between the gate electrode of the third main transistor MT3 and the emission line EML may be disconnected, the connection portion between the source electrode of the third main transistor MT3 and the driving voltage line may be disconnected, and the connection portion between the drain electrode of the third main transistor MT3 and the second node may be disconnected, so that the third main transistor MT3 may be separated from the pixel circuit PC. Further, the gate electrode of the third auxiliary transistor AT3 and the emission line EML may be connected, the source electrode of the third auxiliary transistor AT3 and the driving voltage line may be connected, and the drain electrode of the third auxiliary transistor AT3 and the second node may be connected, so that the third auxiliary transistor AT3 may be connected to the pixel circuit PC.

In another embodiment, the pixel circuit PC may further include, for example, a first auxiliary transistor corresponding to the first main transistor MT1, and a fourth auxiliary transistor corresponding to the fourth main transistor MT4.

Meanwhile, whether or not the main transistor is defective may be determined based on visual inspection. For example, whether or not the main transistor is defective may be determined by an automated optical inspection (AOI) device. The AOI device may detect a defect in the unit of micrometer (μm) using an image processing algorithm and a high-resolution camera.

Figure 6:
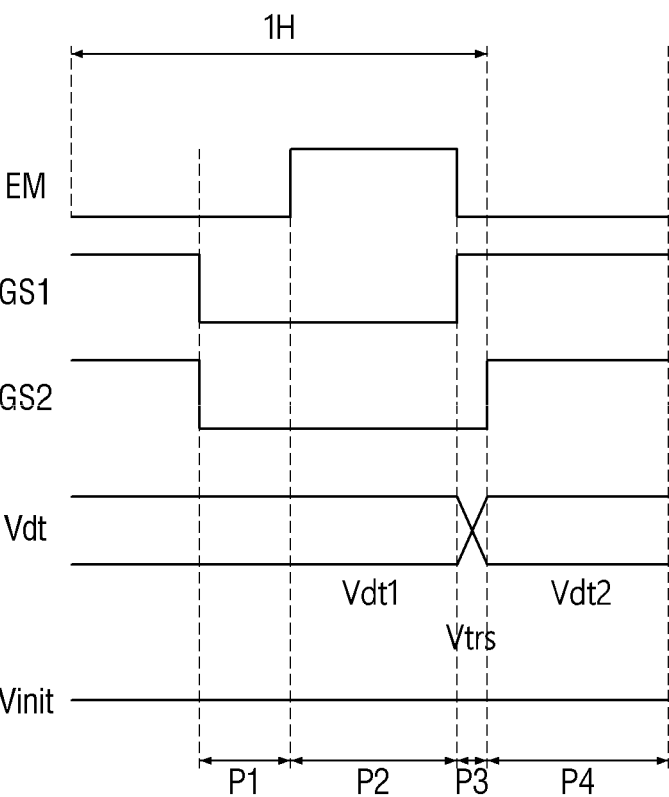
FIG. 6 is a timing diagram of a first gate signal, a second gate signal, an emission signal, a reference voltage, and an initialization voltage of FIG. 5.

FIG. 6 is a timing diagram of the first gate signal GS1, the second gate signal GS2, the emission signal EM, the data signal, and an initialization voltage Vinit of FIG. 5.

As in the example shown in FIG. 6, the operation of the display device 10 may include an initialization/write period P1, a compensation period P2, a bypass period P3, and an emission period P4.

The initialization/write period P1, the compensation period P2, the bypass period P3, and the emission period P4 may correspond to one horizontal period 1H. In other words, one horizontal period 1H may include the initialization/write period P1, the compensation period P2, the bypass period P3, and the emission period P4. Here, the horizontal period 1H may refer to a period during which pixels (e.g., pixels in one row) arranged in a horizontal direction (e.g., the first direction DR1) are driven. Here, the pixels in one row may refer to a plurality of pixels connected to a gate line (e.g., the first gate line GL1) in common and respectively connected to a plurality of different data lines DL.

Figure 11:
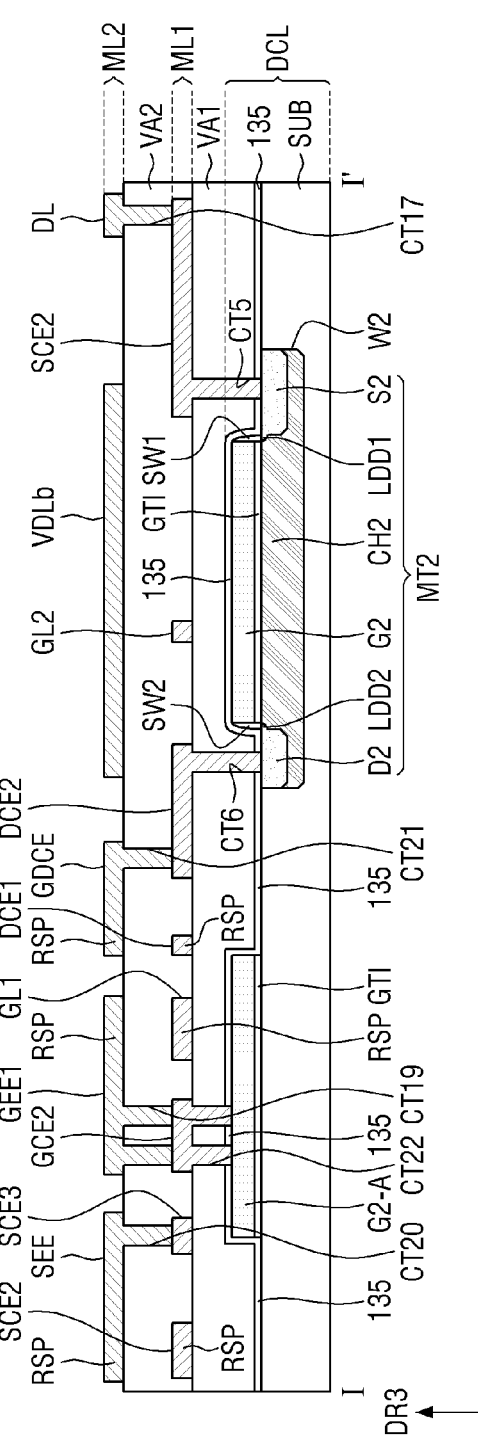
FIG. 11 is a cross-sectional view taken along line I-I' of FIG. 10.

The first gate signal GS1, the second gate signal GS2, and the emission signal EM may each have an active level or a non-active level for each period. Here, the active level of each signal GS1, GS2, EM may mean a voltage at a level capable of turning on a corresponding transistor to which the corresponding signal is applied. In other words, the active level signal may have a value less than the threshold voltage of the corresponding transistor. For example, as shown in FIG. 5, when each of the transistors T1 to T4 is a P-type transistor, the active level of each signal GS1, GS2, EM may mean a voltage lower than the threshold voltage of the corresponding transistor. Meanwhile, the non-active level of each signal GS1, GS2, EM may mean a voltage at a level capable of turning off a corresponding transistor. In other words, the non-active level signal may have a greater value than the threshold voltage of the corresponding transistor. For example, as shown in FIG. 11, when each of the transistors T1 to T4 is a P-type transistor, the non-active level of each signal GS1, GS2, EM may mean a voltage higher than the threshold voltage of the corresponding transistor. On the other hand, when each of the transistors T1 to T4 is an N-type transistor, the active level of each signal GS1, GS2, EM may mean a voltage higher than the threshold voltage of the corresponding transistor, and the non-active level of each signal GS1, GS2, EM may mean a voltage lower than the threshold voltage of the corresponding transistor.

In the initialization/write period P1, the emission signal EM, the first gate signal GS1, and the second gate signal GS2 may each have an active level. Further, in the initialization/write period P1, the data voltage Vdt may be applied to the data line DL. The data voltage Vdt may be a voltage having a specific gray level (or luminance) for displaying an image. In this case, the data voltage Vdt in the initialization/write period P1 may be a data voltage Vdt1 (hereinafter, referred to as a previous data voltage) of a previous horizontal period.

In the compensation period P2, the first gate signal GS1 and the second gate signal GS2 may each have an active level. Further, in the compensation period P2, the previous data voltage Vdt1 may be applied to the data line DL.

In the bypass period P3, the emission signal EM and the second gate signal GS2 may each have an active level, and the first gate signal GS2 may have a non-active level. Further, in the bypass period P3, the data voltage Vdt of the data line DL may be a transient data voltage Vtrs that is changed (or shifted) from the previous data voltage Vdt1 to a current data voltage Vdt2.

In the emission period P4, the emission signal EM may have an active level, and the first gate signal GS1 and the second gate signal GS2 may each have a non-active level. Further, in the emission period P4, the data voltage Vdt may be applied to the data line DL. The data voltage Vdt may be a voltage having a specific gray level (or luminance) for displaying an image. In this case, the data voltage Vdt in the emission period P4 may be the data voltage Vdt2 (hereinafter, referred to as the current data voltage) of a current horizontal period.

Meanwhile, the aforementioned initialization voltage Vinit may be maintained at a constant level during all periods including the initialization/write period P1, the compensation period P2, the bypass period P3, and the emission period P4. For example, the initialization voltage Vinit may be a DC voltage having a constant level regardless of periods. Here, the initialization voltage Vinit may be, for example, a DC voltage higher than a common voltage ELVSS and lower than a driving voltage ELVDD.

The operation of the display device according to one embodiment of the present disclosure will be described with reference to FIGS. 5 and 6.

First, the operation of the display device in the initialization/write period P1 will be described.

As shown in FIG. 5, in the initialization/write period P1, the emission signal EM, the first gate signal GS1, and the second gate signal GS2 may each have an active level. Further, in the initialization/write period P1, the previous data voltage Vdt1 may be applied to the data line DL.

The active level first gate signal GS1 may be applied to the gate electrode of the second main transistor MT2 through the first gate line GL1. Accordingly, the second main transistor MT2 may be turned on.

The active level second gate signal GS2 may be applied to the gate electrode of the fourth main transistor MT4 through the second gate line GL2. Accordingly, the fourth main transistor MT4 may be turned on.

The active level emission signal EM may be applied to the gate electrode of the third main transistor MT3 through the emission line EML. Accordingly, the third main transistor MT3 may be turned on.

The first main transistor MT1 may be turned on by the previous data voltage Vdt1.

Since the second main transistor MT2, the third main transistor MT3, and the fourth main transistor MT4 described above are turned on in the initialization/write period P1, the gate electrode (for example, the first node N1) of the first main transistor MT1, the source electrode (for example, the second node N2) of the first main transistor MT1, and the drain electrode (for example, the third node N3) of the first main transistor MT1 may be initialized. For example, the previous data voltage Vdt1 from the data line DL may be applied to the first node N1 that is the gate electrode of the first main transistor MT1 through the turned-on second main transistor MT2. Further, the driving voltage ELVDD from the driving voltage line VDL may be applied to the second node N2 that is the source electrode of the first main transistor MT1 through the turned-on third main transistor MT3. Further, the initialization voltage Vinit from the initialization line VIL may be applied to the third node N3 that is the drain electrode of the first main transistor MT1 through the turned-on fourth main transistor MT4. Accordingly, each voltage of the gate electrode of the first main transistor MT1, the source electrode of the first main transistor MT1, and the drain electrode of the first main transistor MT1 may be initialized. For example, the gate electrode of the first main transistor MT1 may be initialized to the previous data voltage Vdt1, the source electrode of the first main transistor MT1 may be initialized to the driving voltage ELVDD, and the drain electrode of the first main transistor MT1 (or the anode electrode of the light emitting element ED) may be initialized to the initialization voltage Vinit.

Further, a current path may be generated between the driving voltage line VDL and the initialization line VIL through the turned-on first main transistor MT1. Each voltage of the source electrode and the drain electrode of the first main transistor MT1 described above may be initialized by the current flowing through the current path.

Next, the operation of the display device in the compensation period P2 will be described.

As shown in FIG. 6, in the compensation period P2, the first gate signal GS1 and the second gate signal GS2 may each have an active level, and the emission signal EM may have a non-active level. Further, in the compensation period P2, the previous data voltage Vdt1 may be applied to the data line DL.

The active level first gate signal GS1 may be applied to the gate electrode of the second main transistor MT2 through the first gate line GL1. Accordingly, the second main transistor MT2 may be turned on.

The active level second gate signal GS2 may be applied to the gate electrode of the fourth main transistor MT4 through the second gate line GL2. Accordingly, the fourth main transistor MT4 may be turned on.

The non-active level emission signal EM may be applied to the gate electrode of the third main transistor MT3 through the emission line EML. Accordingly, the third main transistor MT3 may be turned off.

The first main transistor MT1 may be turned on by the previous data voltage Vdt1. In the compensation period P2, the threshold voltage of the first main transistor MT1 may be stored in the first capacitor C1. For example, the threshold voltage of the first main transistor MT1 may be stored in the first capacitor C1 in a source-follower method. In this case, the voltage of the second node N2 may be, for example, a voltage obtained by subtracting the threshold voltage of the first main transistor MT1 described above from the previous data voltage Vdt1.

Next, the operation of the display device in the bypass period P3 will be described.

As shown in FIG. 5, in the bypass period P3, the emission signal EM and the second gate signal GS2 may each have an active level, and the first gate signal GS2 may have a non-active level. Further, in the bypass period P3, the data voltage Vdt of the data line DL may be the transient data voltage Vtrs that is changed (or shifted) from the previous data voltage Vdt1 to the current data voltage Vdt2.

The non-active level first gate signal GS1 may be applied to the gate electrode of the second main transistor MT2 through the first gate line GL1. Accordingly, the second main transistor MT2 may be turned off.

The active level second gate signal GS2 may be applied to the gate electrode of the fourth main transistor MT4 through the second gate line GL2. Accordingly, the fourth main transistor MT4 may be turned on.

The active level emission signal EM may be applied to the gate electrode of the third main transistor MT3 through the emission line EML. Accordingly, the third main transistor MT3 may be turned on.

The first main transistor MT1 may be turned on by the previous data voltage Vdt1.

In the bypass period P3, the first gate signal GS1 is changed (or shifted) from the active level to the non-active level, so that the second main transistor MT2 may be turned on for a short time. Then, there may be a problem that the abnormal driving current generated by the transient voltage Vtrs of the data line DL may be supplied to the light emitting element ED. In order to prevent the above problem, the fourth main transistor MT4 is turned on in the bypass period P3 so that the abnormal driving current generated by the transient voltage Vtrs is not applied to the light emitting element ED. For example, the abnormal driving current generated by the transient voltage Vtrs may be bypassed to the initialization line VIL through the turned-on fourth main transistor MT4.

Next, the operation of the display device in the emission period P4 will be described.

As shown in FIG. 6, in the emission period P4, the emission signal EM may have an active level, and the first gate signal GS1 and the second gate signal GS2 may each have a non-active level. Further, in the emission period P4, the current data voltage Vdt2 may be applied to the data line DL.

The non-active level first gate signal GS1 may be applied to the gate electrode of the second main transistor MT2 through the first gate line GL1. Accordingly, the second main transistor MT2 may be turned off.

The non-active level second gate signal GS2 may be applied to the gate electrode of the fourth main transistor MT4 through the second gate line GL2. Accordingly, the fourth main transistor MT4 may be turned off.

The active level emission signal EM may be applied to the gate electrode of the third main transistor MT3 through the emission line EML. Accordingly, the third main transistor MT3 may be turned on.

The first main transistor MT1 may be turned on by the current data voltage Vdt2.

The current path from the driving voltage line VDL to the common voltage line VSL may be generated by the third main transistor MT3 and the first main transistor MT1 that are turned on, and the driving current may flow through the current path. This driving current is supplied to the light emitting element ED, and the light emitting element ED may emit light according to the driving current.

Figure 7:
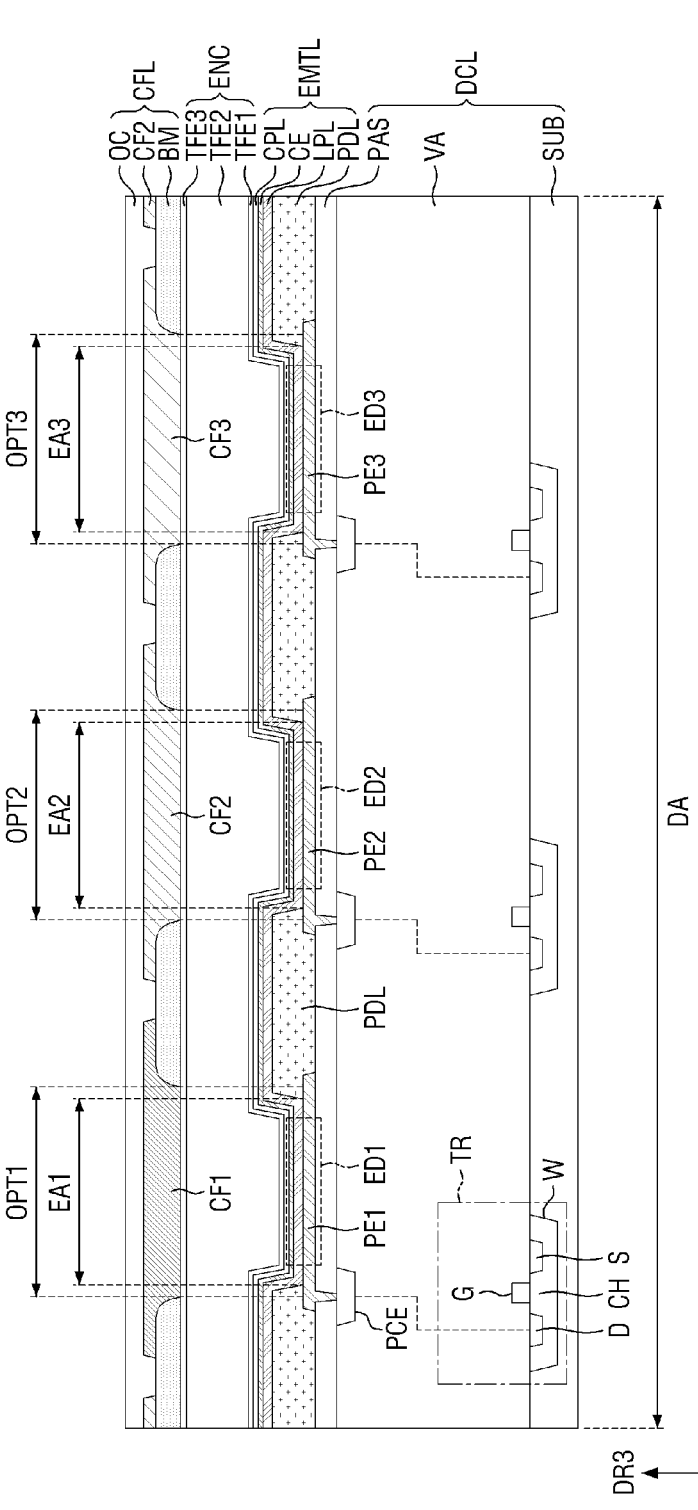
FIG. 7 is a cross-sectional view of a display device according to one embodiment.

FIG. 7 is a cross-sectional view of a display device according to one embodiment.

As shown in FIG. 7, the display device 10 may include the driving circuit layer DCL, the light emitting element layer EMTL, the encapsulation layer ENC, and the color filter layer CFL.

The substrate SUB may be a silicon substrate SUB, a germanium substrate SUB, or a silicon-germanium substrate SUB. The substrate SUB may be a substrate SUB doped with first type impurities.

A well region W may be disposed on the substrate SUB (or in the substrate SUB). The well region W may be a region doped with second type impurities. The second type impurity may be different from the aforementioned first type impurity. For example, when the first type impurity is a p-type impurity, the second type impurity may be an n-type impurity. Meanwhile, when the first type impurity is an n-type impurity, the second type impurity may be a p-type impurity.

A source region S, a drain region D, and a channel region CH of a transistor TR may be disposed in the well region W. For example, the source region S (or source electrode) and the drain region D (or drain electrode) of the transistor TR may be disposed in the well region W. Each of the source region S and the drain region D may be a region doped with the aforementioned first type impurities. The gate electrode G of the transistor TR may intersect and overlap the well region W. In a plan view, the well region W intersected by the gate electrode G may include two parts, and the source region S may be disposed in any one of the two parts, and the drain region D may be disposed in the other part thereof. In other words, in the well region W, the source region S and the drain region D may be disposed on both sides of the gate electrode G with the gate electrode G interposed therebetween in a plan view. The channel region CH of the transistor may be disposed in the region of the well region W that overlaps the gate electrode G. The transistor TR shown in FIG. 7 may be, for example, the first main transistor MT1 of FIG. 5.

Meanwhile, the source region S may include a first lightly doped impurity region having an impurity concentration relatively lower than that of another portion of the source region S. In other words, the lightly doped source region S may include a lower concentration of impurities than the another portion of the source region S. The drain region D may include a second lightly doped impurity region having an impurity concentration relatively lower than that of another portion of the drain region D. In other words, the lightly doped drain region D may include a lower concentration of impurities than the another portion of the drain region D.

The first lightly doped impurity region and the second lightly doped impurity region may be disposed closer to the channel region CH of the transistor TR to form a lightly doped drain (LDD) structure. For example, the first lightly doped impurity region may be disposed close to the channel region CH to overlap a first sidewall disposed on one side of the gate electrode G, and the second lightly doped impurity region may be disposed close to the channel region CH to overlap a second sidewall disposed on the other side of the gate electrode G. In this way, the distance between the heavily doped impurity region of the source region S and the heavily doped impurity region of the drain region D may be increased due to the first lightly doped impurity region and the second lightly doped impurity region, and the length of the channel region CH may be increased due to the increase in the distance. Accordingly, punch-through and hot carrier phenomena caused by a short channel may be prevented.

An interlayer insulating layer VA may be disposed on the substrate SUB.

A passivation layer PAS may be disposed on the interlayer insulating layer VA.

The light emitting element layer EMTL may be disposed on the passivation layer PAS. The light emitting element layer EMTL may include, for example, a first light emitting element ED1, a second light emitting element ED2, and a third light emitting element ED3 disposed in different emission areas. For example, the first light emitting element ED1 of the light emitting element layer EMTL may be disposed in a first emission area EA1, the second light emitting element ED2 of the light emitting element layer EMTL may be disposed in a second emission area EA2, and the third light emitting element ED3 of the light emitting element layer EMTL may be disposed in a third emission area EA3.

Each of the first light emitting element ED1, the second light emitting element ED2, and the third light emitting element ED3 may provide white light.

The first light emitting element ED1 may include a first pixel electrode PE1 (or first anode electrode), a light providing layer LPL, and a common electrode CE stacked in a third direction DR3.

The second light emitting element ED2 may include a second pixel electrode PE2 (or second anode electrode), the light providing layer LPL, and the common electrode CE stacked in the third direction DR3.

The third light emitting element ED3 may include a third pixel electrode PE3 (or third anode electrode), the light providing layer LPL, and the common electrode CE stacked in the third direction DR3.

Here, the light providing layer LPL and the common electrode CE may be common layers commonly used by the light emitting elements ED1 to ED3. In other words, the plurality of light emitting elements ED1 to ED3 of the light emitting element layer EMTL may share the light providing layer LPL and the common electrode CE.

The light providing layer LPL may include a plurality of light emitting layers providing lights of different colors, and the plurality of light emitting layers may be stacked along the third direction DR3. Different lights from the plurality of light emitting layers may be mixed to generate white light. Meanwhile, the light providing layer LPL may further include a charge generation layer.

The first pixel electrode PE1, the second pixel electrode PE2, and the third pixel electrode PE3 may be connected to each drain region D of each driving transistor TR through a pixel connection electrode PCE.

The first pixel electrode PE1 may be disposed to correspond to the first emission area EA1, the second pixel electrode PE2 may be disposed to correspond to the second emission area EA2, and the third pixel electrode PE3 may be disposed to correspond to the third emission area EA3.

A bank PDL (or pixel defining layer) may be disposed on the first pixel electrode PE1, the second pixel electrode PE2, and the third pixel electrode PE3. The bank PDL may define the emission areas of the pixels (for example, the first emission area EA1 of the first pixel PX1, the second emission area EA2 of the second pixel PX2, and the third emission area EA3 of the third pixel PX3). To this end, the bank PDL may be disposed to expose a partial region of each of the first pixel electrode PE1, the second pixel electrode PE2, and the third pixel electrode PE3 on the passivation layer PAS. The bank PDL may cover the edge of each of the first pixel electrode PE1, the second pixel electrode PE2, and the third pixel electrode PE3. The bank PDL may be formed of an organic layer such as acryl resin, epoxy resin, phenolic resin, polyamide resin, polyimide resin and the like.

The light providing layer LPL may be disposed on the pixel electrodes PE1, PE2, and PE3 and the bank PDL. For example, the light providing layer LPL may be disposed on the first pixel electrode PE1, the second pixel electrode PE2, the third pixel electrode PE3, and the bank PDL.

The light providing layer LPL may include a plurality of light emitting units. For example, the light providing layer LPL may include a first light emitting unit, a second light emitting unit, and a third light emitting unit stacked in the third direction DR3. The light emitting units may provide light of different wavelengths. For example, the first light emitting unit, the second light emitting unit, and the third light emitting unit may emit lights of different colors. For example, the light providing layer LPL may have a tandem structure in which the plurality of light emitting units providing lights of different colors are stacked in a vertical direction (for example, the third direction DR3).

The first light emitting unit may be disposed on the pixel electrodes PE1, PE2, and PE3. The first light emitting unit may include a first light emitting layer, a hole transporting layer, an organic material layer, and an electron transporting layer.

A second light emitting unit may be disposed on the first light emitting unit. The second light emitting unit may include a second light emitting layer, a hole transporting layer, an organic material layer, and an electron transporting layer.

A third light emitting unit may be disposed on the second light emitting unit. The third light emitting unit may include a third light emitting layer, a hole transporting layer, an organic material layer, and an electron transporting layer.

The light emitting elements ED1, ED2, and ED3 may provide white light by mixing light of a first color (for example, blue) from the first light emitting unit, light of a second color (for example, red) from the second light emitting unit, and light of a third color (for example, green) from the third light emitting unit. For example, each of the first light emitting element ED1, the second light emitting element ED2, the third light emitting element ED3, and a dummy light emitting element DEL may provide white light.

Further, the light providing layer LPL may further include at least one charge generation layer in addition to the aforementioned light emitting units. The charge generation layer may be disposed between the light emitting units adjacent in the third direction DR3, for example. The charge generation layer may include a first charge generation layer and a second charge generation layer stacked in the third direction DR3, for example. In this case, the first charge generation layer may be disposed between the first light emitting unit and the second light emitting unit, and the second charge generation layer may be disposed between the second light emitting unit and the third light emitting unit.

On the other hand, each charge generation layer may include a negative charge generation layer and a positive charge generation layer. For example, the first charge generation layer may include a first negative charge generation layer and a first positive charge generation layer stacked in the third direction DR3, and the second charge generation layer may include a second negative charge generation layer and a second positive charge generation layer stacked in the third direction DR3.

The common electrode CE may be disposed on the light providing layer LPL. For example, the common electrode CE may be disposed on the light providing layer LPL to overlap the first pixel electrode PE1, the second pixel electrode PE2, the third pixel electrode PE3, the first emission area EA1, the second emission area EA2, the third emission area EA3, and the bank PDL. In the top emission structure, the common electrode CE may be formed of a transparent conductive material (TCO) such as ITO or IZO capable of transmitting light or a semi-transmissive conductive material such as magnesium (Mg), silver (Ag), or an alloy of magnesium (Mg) and silver (Ag). When the common electrode CM is formed of a semi-transmissive conductive material, the light emission efficiency can be increased due to a micro-cavity effect.

A capping layer CPL may be disposed on the common electrode CE. The capping layer CPL may include an inorganic insulating material. In an exemplary embodiment, the capping layer CPL may include aluminum oxide, titanium oxide, tantalum oxide, hafnium oxide, zinc oxide, silicon oxide, silicon nitride, and/or silicon oxynitride.

The encapsulation layer ENC may be disposed on the capping layer CPL. The encapsulation layer ENC may cover the top surface and the side surface of the light emitting element layer EMTL, and may protect the light emitting element layer EMTL. The encapsulation layer ENC may include at least one inorganic layer and at least one organic layer for encapsulating the light emitting element layer EMTL. The encapsulation layer ENC may include at least one inorganic layer TFE1 and TFE3 to prevent oxygen or moisture from permeating into the light emitting element layer EMTL. In addition, the encapsulation layer ENC may include at least one organic layer to protect the light emitting element layer EMTL from foreign substances such as dust. For example, the encapsulation layer ENC may include a first inorganic encapsulation layer TFE1, an organic encapsulation layer TFE2, and a second inorganic encapsulation layer TFE3.

The first inorganic encapsulation layer TFE1 may be disposed on the capping layer CPL, the organic encapsulation layer TFE2 may be disposed on the first inorganic encapsulation layer TFE1, and the second inorganic encapsulation layer TFE3 may be disposed on the organic encapsulation layer TFE2. The first inorganic encapsulation layer TFE1 and the second inorganic encapsulation layer TFE3 may be formed of a multilayer in which one or more inorganic layers of a silicon nitride layer, a silicon oxynitride layer, a silicon oxide layer, a titanium oxide layer and an aluminum oxide layer are alternately stacked. The encapsulation organic layer TFE2 may be an organic layer such as acryl resin, epoxy resin, phenolic resin, polyamide resin, polyimide resin or the like.

A light blocking layer BM may be disposed on the encapsulation layer ENC. The light blocking layer BM may include a plurality of holes OPT1, OPT2, and OPT3 disposed to overlap the emission areas EA1, EA2, and EA3. For example, the first hole OPT1 may be disposed in an area corresponding to the first emission area EA1. The second hole OPT2 may be disposed in an area corresponding to the second emission area EA2, and the third hole OPT3 may be disposed in an area corresponding to the third emission area EA3. The areas or sizes of the holes OPT1, OPT2, and OPT3 may be larger than the areas or sizes of the emission areas EA1, EA2, and EA3 defined by the bank PDL, respectively. The holes OPT1, OPT2, and OPT3 of the light blocking layer BM are formed to be larger than the emission areas EA1, EA2, and EA3, so that the light emitted from the emission areas EA1, EA2, and EA3 may be visually recognized by the user not only from the front surface but also from the side surface of the display device 10.

The light blocking layer BM may include a light absorbing material. For example, the light blocking layer BM may include an inorganic black pigment or an organic black pigment. The inorganic black pigment may be carbon black, and the organic black pigment may include at least one of lactam black, perylene black, or aniline black, but they are not limited thereto. The light blocking layer BM may prevent visible light infiltration and color mixture between the first to third emission areas EA1, EA2, and EA3, which leads to the improvement of color reproducibility of the display device 10.

Further, the display device 10 may include a plurality of color filters CF1, CF2, and CF3 disposed on the emission areas EA1, EA2, and EA3. The plurality of color filters CF1, CF2, and CF3 may be disposed to correspond to the emission areas EA1, EA2, and EA3, respectively. For example, the color filters CF1, CF2, and CF3 may be disposed on the light blocking layer BM including the plurality of holes OPT1, OPT2, and OPT3 disposed to correspond to the emission areas EA1, EA2, and EA3, respectively.

The color filters CF1, CF2, and CF3 may include a first color filter CF1, a second color filter CF2, and a third color filter CF3 disposed to correspond to the different emission areas EA1, EA2, and EA3, respectively. The color filters CF1, CF2, and CF3 may include a colorant such as a dye or a pigment that absorbs light in a wavelength band other than light in a specific wavelength band, and may be disposed to correspond to the color of the light emitted from the emission areas EA1, EA2, and EA3. For example, the first color filter CF1 may be a red color filter that is disposed to overlap the first emission area EA1 and transmits only the first light of the red color. The second color filter CF2 may be a green color filter that is disposed to overlap the second emission area EA2 and transmits only the second light of the green color, and the third color filter CF3 may be a blue color filter that is disposed to overlap the third emission area EA3 and transmits only the third light of the blue color.

The plurality of color filters CF1, CF2, and CF3 may be spaced apart from other adjacent color filters CF1, CF2, and CF3 on the light blocking layer BM. The color filters CF1, CF2, and CF3 may have areas larger than those of the holes OPT1, OPT2, and OPT3 of the light blocking layer BM, respectively, while covering the holes, and may have areas enough to be spaced apart from other color filters CF1, CF2, and CF3 on the light blocking layer BM. However, the present disclosure is not limited thereto. The plurality of color filters CF1, CF2, and CF3 may be disposed to partially overlap other adjacent color filters CF1, CF2, and CF3 on the light blocking layer BM. The different color filters CF1, CF2, and CF3 do not overlap each other in the emission areas EA1, EA2, and EA3, and may overlap each other on the light blocking layer BM. In the display device, the color filters CF1, CF2, and CF3 are disposed to overlap each other on the light blocking layer BM, so that the intensity of the reflected light by external light may be reduced. Furthermore, the color of the reflected light by the external light may be controlled by adjusting the disposition, shape, and area of the color filters CF1, CF2, and CF3 in a plan view.

An overcoat layer OC may be disposed on the color filters CF1, CF2, and CF3 to planarize steps formed on the color filters CF1, CF2, and CF3. The overcoat layer OC may be a colorless light transmissive layer that does not have a color in a visible light band. For example, the overcoat layer OC may include a colorless light transmissive organic material such as an acrylic resin.

Figure 8:
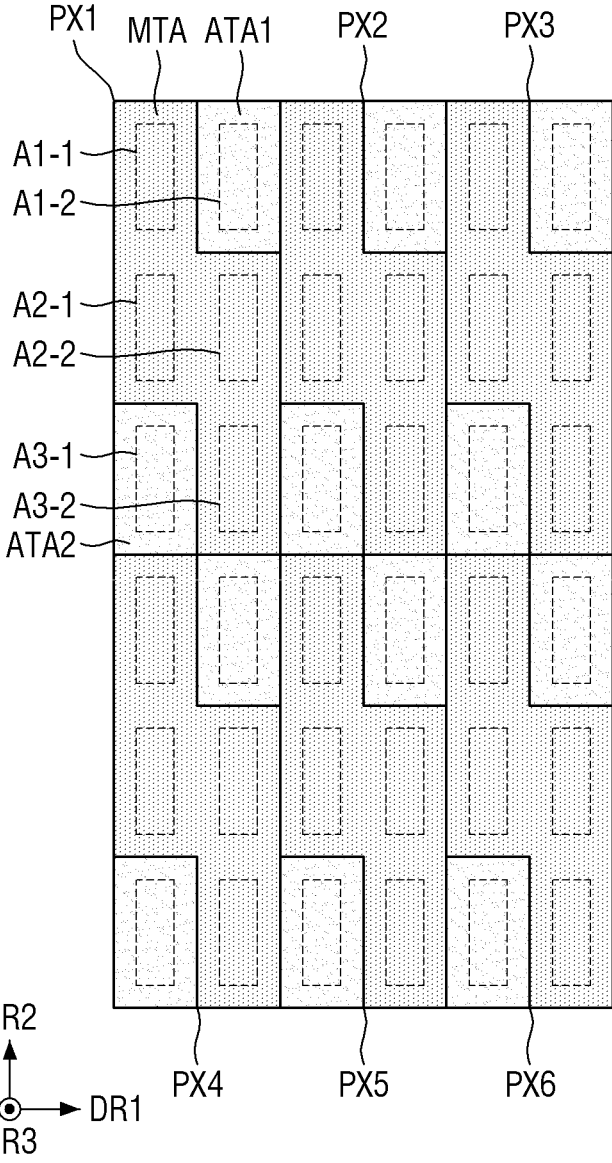
FIG. 8 is a plan view of a display device according to one embodiment.

FIG. 8 is a plan view of a display device according to one embodiment.

As shown in FIG. 8, the display device may include a plurality of pixels PX1, PX2, PX3, PX4, PX5, and PX6. The plurality of pixels PX1, PX2, PX3, PX4, PX5, and PX6 may be arranged in the first direction DR1 and the second direction DR2.

Each of the pixel PX1, PX2, PX3, PX4, PX5, and PX6 may include six transistor areas disposed in three rows and two columns. For example, the first pixel may include a first-first transistor area A1-1, a first-second transistor area A1-2, a second-first transistor area A2-1, a second-second transistor area A2-2, a third-first transistor area A3-1, and a third-second transistor area A3-2 disposed in three rows and two columns.

The first main transistor MT1 may be disposed in the first-first transistor area A1-1 corresponding to the first column of the first row.

The second main transistor MT2 may be disposed in the third-second transistor area A3-2 corresponding to the second column of the third row.

The third main transistor MT3 may be disposed in the second-second transistor area A2-2 corresponding to the second column of the second row.

The fourth main transistor MT4 may be disposed in the second-first transistor area A2-1 corresponding to the first column of the second row.

The second auxiliary transistor AT2 may be disposed in the third-first transistor area A3-1 corresponding to the first column of the third row.

The third auxiliary transistor AT3 may be disposed in the first-second transistor area A1-2 corresponding to the second column of the first row.

When the area including the first-first transistor area A1-1, the second-first transistor area A2-1, the second-second transistor area A2-2, and the third-second transistor area A3-2 is defined as the main transistor area MTA, the main transistor area MTA may have a bent shape.

The first-second transistor area A1-2 may be a first auxiliary transistor area ATA1, and the third-first transistor area A3-1 may be a second auxiliary transistor area ATA2.

The first-second transistor area A1-2 where a third auxiliary transistor AT3 is disposed may be disposed close to the second-second transistor area A2-2 in the second direction DR2 where the third main transistor MT3 is disposed. Accordingly, the third auxiliary transistor AT3 may be disposed close to the third main transistor MT3. Therefore, when the third main transistor MT3 is defective, the third auxiliary transistor AT3 may be connected to the pixel circuit PC of the third main transistor MT3 which is disposed close to the third auxiliary transistor AT3.

The third-first transistor area A3-1 where the second auxiliary transistor AT2 is disposed may be disposed close to the third-second transistor area A3-2 in the first direction DR1 where the second main transistor MT2 is disposed. Accordingly, the second auxiliary transistor AT2 may be disposed close to the second main transistor MT2. Therefore, when the second main transistor MT2 is defective, the second auxiliary transistor AT2 may be connected to the pixel circuit PC of the second main transistor MT2 which is disposed close to the second auxiliary transistor AT2.

Figure 9:
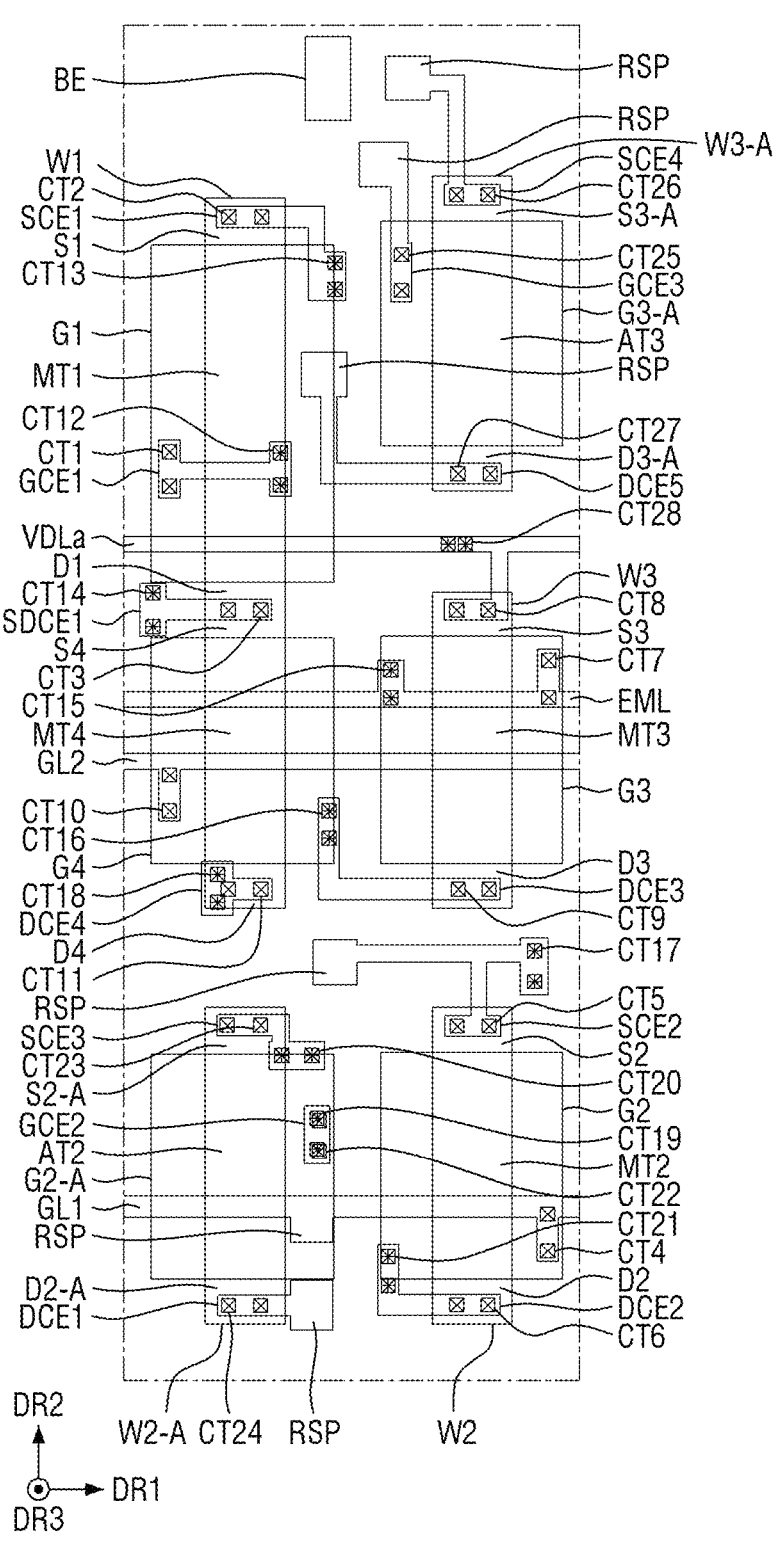
FIG. 9 is a plan view of a display device according to one embodiment.
Figure 10:
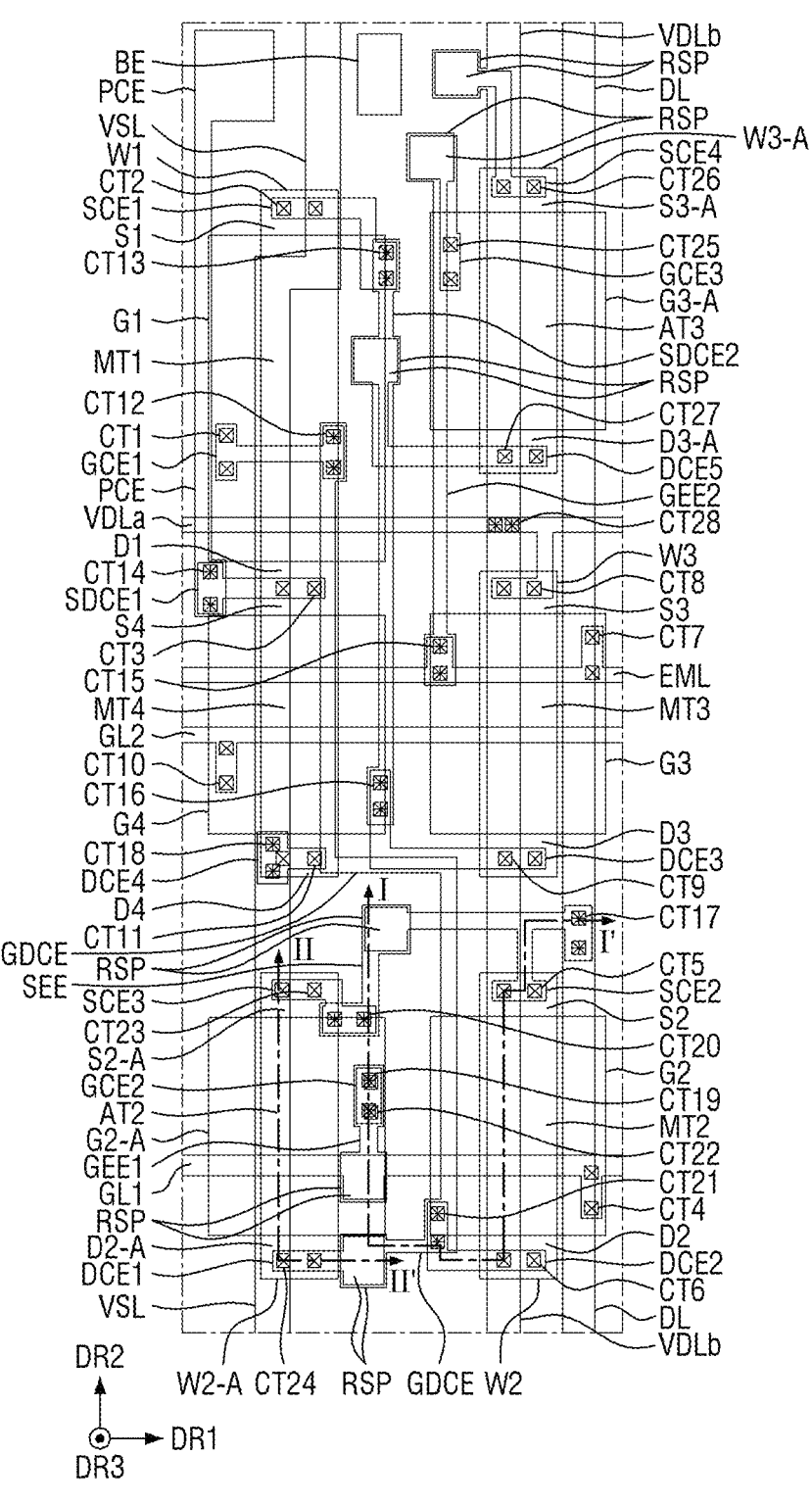
FIG. 10 is a view in which a second metal layer is further added to FIG. 9.
Figure 12:
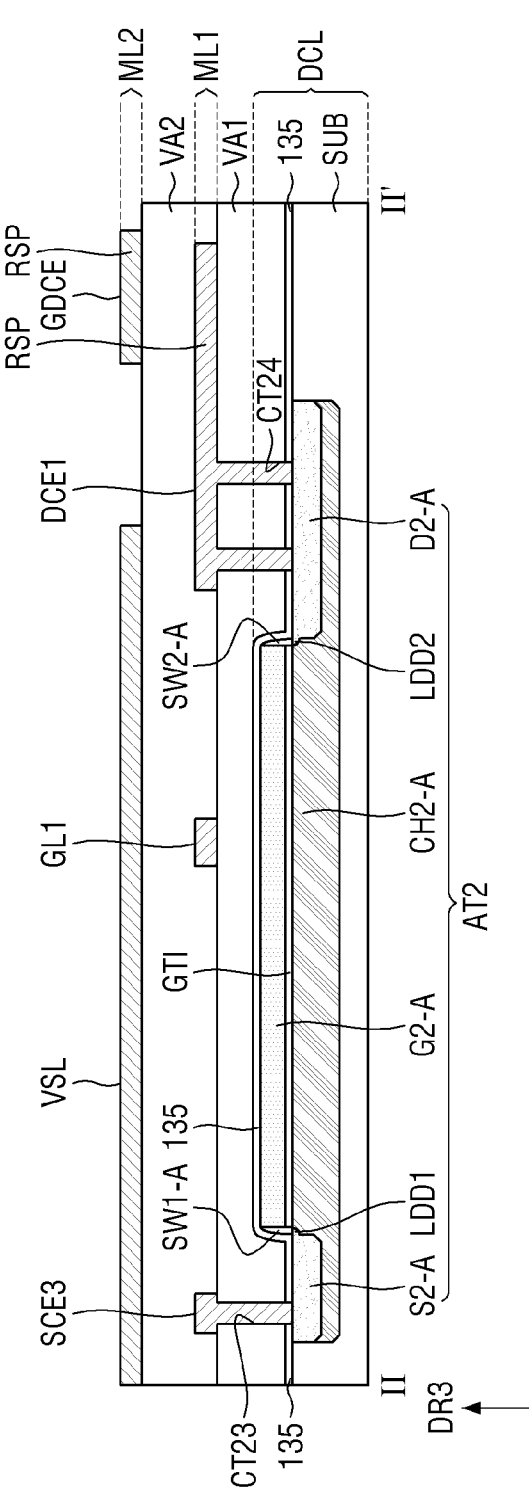
FIG. 12 is a cross-sectional view taken along line II-II' of FIG. 10.

FIG. 9 is a plan view of a display device according to one embodiment, FIG. 10 is a view in which a second metal layer ML2 is further added to FIG. 9, FIG. 11 is a cross-sectional view taken along line I-I' of FIG. 10, and FIG. 12 is a cross-sectional view taken along line II-II' of FIG. 10.

As shown in FIGS. 11 and 12, the display device may include the driving circuit layer DCL, a first interlayer insulating layer VA1, a first metal layer ML1, and a second interlayer insulating layer VA2, and the second metal layer ML2 that are stacked along the third direction DR3.

As in the example shown in FIGS. 9 to 12, the driving circuit layer DCL may include the substrate SUB, a gate insulating layer GTI, a body electrode BE, a passivation layer 135, the first main transistor MT1, the second main transistor MT2, the third main transistor MT3, the fourth main transistor MT4, the second auxiliary transistor AT2, and the third auxiliary transistor AT3.

As shown in FIG. 9, the first main transistor MT1 may include a first gate electrode G1 overlapping a first well region W1, a first source electrode S1 disposed at one edge of the first well region W1 so as not to overlap the first gate electrode G1, and a first drain electrode D1 disposed at the central portion of the first well region W1 so as not to overlap the first gate electrode G1.

As shown in FIG. 9, the second main transistor MT2 may include a second gate electrode G2 overlapping a second well region W2, a second source electrode S2 disposed at one edge of the second well region W2 so as not to overlap the second gate electrode G2, and a second drain electrode D2 disposed at the other edge of the second well region W2 so as not to overlap the second gate electrode G2.

As shown in FIG. 9, the third main transistor MT3 may include a third gate electrode G3 overlapping a third well region W3, a third source electrode S3 disposed at one edge of the third well region W3 so as not to overlap the third gate electrode G3, and a third drain electrode D3 disposed at the other edge of the third well region W3 so as not to overlap the third gate electrode G3.

As shown in FIG. 9, the fourth main transistor MT4 may include a fourth gate electrode G4 overlapping the first well region W1, a fourth source electrode S4 disposed at the central portion of the first well region W1 so as not to overlap the fourth gate electrode G4, and a fourth drain electrode D4 disposed at the other edge of the first well region W1 so as not to overlap the fourth gate electrode G4. Here, the fourth source electrode S4 and the aforementioned first drain electrode D1 may be integrally formed.

As shown in FIG. 9, the second auxiliary transistor AT2 may include a second gate electrode G2-A overlapping a second auxiliary well region W2-A, a second source electrode S2-A disposed at one edge of the second auxiliary well region W2-A so as not to overlap the second gate electrode G2-A, and a second drain electrode D2-A disposed at the other edge of the second auxiliary well region W2-A so as not to overlap the second gate electrode G2-A.

As shown in FIG. 9, the third auxiliary transistor AT3 may include a third gate electrode G3-A overlapping a third auxiliary well region W3-A, a third source electrode S3-A disposed at one edge of the third auxiliary well region W3-A so as not to overlap the third gate electrode G3-A, and a third drain electrode D3-A disposed at the other edge of the third auxiliary well region W3-A so as not to overlap the third gate electrode G3-A.

When the substrate SUB is a substrate doped with first type impurities, the first well region W1, the second well region W2, the third well region W3, the second auxiliary well region W2-A, and the third auxiliary well region W3-A may be regions doped with second type impurities. The second type impurity may be different from the aforementioned first type impurity. For example, when the first type impurity is a p-type impurity, the second type impurity may be an n-type impurity. Meanwhile, when the first type impurity is an n-type impurity, the second type impurity may be a p-type impurity.

In addition, each transistor (for example, each main transistor and each auxiliary transistor) may further include a channel region, a lightly doped impurity region, and a sidewall. For example, as shown in FIG. 11, the second main transistor MT2 may further include a second channel region CH2, a first lightly doped impurity region LDD1, a second lightly doped impurity region LDD2, a first sidewall SW1, and a second sidewall SW2. For another example, as shown in FIG. 12, the second auxiliary transistor AT2 may further include a second channel region CH2-A, the first lightly doped impurity region LDD1, the second lightly doped impurity region LDD2, a first sidewall SW1-A, and a second sidewall SW2-A.

The body electrode BE may be connected to the driving voltage line VDL. The body electrode BE may be made of the same material as that of the source electrode or the drain electrode of the aforementioned transistor. For example, the body electrode BE may be made of the same material as that of the first source electrode SE1.

As shown in FIGS. 11 and 12, the first interlayer insulating layer VA1 may be disposed on the driving circuit layer DCL. For example, the first interlayer insulating layer VA1 may be disposed on the entire surface of the driving circuit layer DCL.

As shown in FIGS. 11 and 12, the first metal layer ML1 may be disposed on the first interlayer insulating layer VA1.

As shown in FIGS. 9 to 12, the first metal layer ML1 may include a first gate connection electrode GCE1, a second gate connection electrode GCE2, a third gate connection electrode GCE3, a first source connection electrode SCE1, a second source connection electrode SCE2, a third source connection electrode SCE3, a fourth source connection electrode SCE4, a first drain connection electrode DCE1, a second drain connection electrode DCE2, a third drain connection electrode DCE3, a fourth drain connection electrode DCE4, a fifth drain connection electrode DCE5, a first source/drain connection electrode SDCE1, the first gate line GL1, the second gate line GL2, the emission line EML, and a lower driving voltage line VDLa. The first metal layer ML1 may be formed of, for example, tungsten.

The first gate connection electrode GCE1 may be connected to the first gate electrode G1 of the first main transistor MT1 through a first contact hole CT1 formed through the first interlayer insulating layer VA1 and the passivation layer 135.

The second gate connection electrode GCE2 may be connected to the second gate electrode G2-A of the second auxiliary transistor AT2 through a twenty-second contact hole CT22 formed through the first interlayer insulating layer VA1 and the passivation layer 135.

The third gate connection electrode GCE3 may be connected to the third gate electrode G3-A of the third auxiliary transistor AT3 through a twenty-fifth contact hole CT25 formed through the first interlayer insulating layer VA1 and the passivation layer 135. The third gate connection electrode GCE3 may include a repair short portion RSP.

The first source connection electrode SCE1 may be connected to the first source electrode S1 of the first main transistor MT1 through a second contact hole CT2 formed through the first interlayer insulating layer VA1 and the passivation layer 135.

The second source connection electrode SCE2 may be connected to the second source electrode S2 of the second main transistor MT2 through a fifth contact hole CT5 formed through the first interlayer insulating layer VA1 and the passivation layer 135. The second source connection electrode SCE2 may include the repair short portion RSP.

The third source connection electrode SCE3 may be connected to the second source electrode S2-A of the second auxiliary transistor AT2 through a twenty-third contact hole CT23 formed through the first interlayer insulating layer VA1 and the passivation layer 135.

The fourth source connection electrode SCE4 may be connected to the third source electrode S3-A of the third auxiliary transistor AT3 through a twenty-sixth contact hole CT26 formed through the first interlayer insulating layer VA1 and the passivation layer 135. The fourth source connection electrode SCE4 may include the repair short portion RSP.

The first drain connection electrode DCE1 may be connected to the second drain electrode D2-A of the second auxiliary transistor AT2 through a twenty-fourth contact hole CT24 formed through the first interlayer insulating layer VA1 and the passivation layer 135. The first drain connection electrode DCE1 may include the repair short portion RSP.

The second drain connection electrode DCE2 may be connected to the second drain electrode D2 of the second main transistor MT2 through a sixth contact hole CT6 formed through the first interlayer insulating layer VA1 and the passivation layer 135.

The third drain connection electrode DCE3 may be connected to the third drain electrode D3 of the third main transistor MT3 through a ninth contact hole CT9 formed through the first interlayer insulating layer VA1 and the passivation layer 135.

The fourth drain connection electrode DCE4 may be connected to the fourth drain electrode D4 of the fourth main transistor MT4 through an eleventh contact hole CT11 formed through the first interlayer insulating layer VA1 and the passivation layer 135.

The fifth drain connection electrode DCE5 may be connected to the third drain electrode D3-A of the third auxiliary transistor AT3 through a twenty-seventh contact hole CT27 formed through the first interlayer insulating layer VA1 and the passivation layer 135. The fifth drain connection electrode DCE5 may include the repair short portion RSP. The first source/drain connection electrode SDCE1 may be connected to the first drain electrode D1 of the first main transistor MT1 and the fourth source electrode S4 of the fourth main transistor MT4 through a third contact hole CT3 formed through the first interlayer insulating layer VA1 and the passivation layer 135.

The first gate line GL1 may be connected to the second gate electrode G2 of the second main transistor MT2 through a fourth contact hole CT4 formed through the first interlayer insulating layer VA1 and the passivation layer 135. The first gate line GL1 may include the repair short portion RSP.

The second gate line GL2 may be connected to the fourth gate electrode G4 of the fourth main transistor MT4 through a tenth contact hole CT10 formed through the first interlayer insulating layer VA1 and the passivation layer 135.

The emission line EML may be connected to the third gate electrode G3 of the third main transistor MT3 through a seventh contact hole CT7 formed through the first interlayer insulating layer VA1 and the passivation layer 135.

The lower driving voltage line VDLa may be connected to the third source electrode S3 of the third main transistor MT3 through an eighth contact hole CT8 formed through the first interlayer insulating layer VA1 and the passivation layer 135. The lower driving voltage line VDLa may be a part of the aforementioned driving voltage line VDL. For example, the driving voltage line VDL may include the lower driving voltage line VDLa and an upper driving voltage line VDLb that are disposed on different layers. The lower driving voltage line VDLa and the upper driving voltage line VDLb may extend in directions intersecting each other. For example, the lower driving voltage line VDLa may extend along the first direction DR1, and the upper driving voltage line VDLb may extend along the second direction DR2. A plurality of lower driving voltage lines VDLa and a plurality of upper driving voltage lines VDLb may be provided. The plurality of lower driving voltage lines VDLa may be arranged along the second direction DR2, and the plurality of upper driving voltage lines VDLb may be arranged along the first direction DR1. The plurality of lower driving voltage lines VDLa and the plurality of upper driving voltage lines VDLb may be connected to each other through a contact hole (not shown) formed through the second interlayer insulating layer VA2 to form the driving voltage line VDL. The driving voltage line VDL including the plurality of lower driving voltage lines VDLa and the plurality of upper driving voltage lines VDLb may have a mesh shape.

As shown in FIGS. 11 and 12, the second interlayer insulating layer VA2 may be disposed on the first metal layer ML1. For example, the second interlayer insulating layer VA2 may be disposed on the entire surface of the substrate SUB between the first metal layer ML1 and the second metal layer ML2.

As shown in FIGS. 10 to 12, the second metal layer ML2 may include a pixel connection electrode PCE, a gate/drain connection electrode GDCE, a second source/drain connection electrode SDCE2, a first gate extension electrode GEE1, a second gate extension electrode GEE2, a source extension electrode SEE, the data line DL, the upper driving voltage line VDLb, and the common voltage line VSL. The second metal layer ML2 may be formed of, for example, tungsten.

The pixel connection electrode PCE may be connected to the first source/drain connection electrode SDCE1 through a fourteenth contact hole CT14 formed through the second interlayer insulating layer VA2.

The gate/drain connection electrode GDCE may be connected to the first gate connection electrode GCE1 through a twelfth contact hole CT12 formed through the second interlayer insulating layer VA2. Further, the gate/drain connection electrode GDCE may be connected to the second drain connection electrode DCE2 through a twenty-first contact hole CT21 formed through the second interlayer insulating layer VA2. Further, the gate/drain connection electrode GDCE may include the repair short portion RSP, and the repair short portion RSP of the gate/drain connection electrode GDCE may overlap the repair short portion RSP of the first drain connection electrode DCE1 described above.

The second source/drain connection electrode SDCE2 may be connected to the first source connection electrode SCE1 through a thirteenth contact hole CT13 formed through the second interlayer insulating layer VA2. Further, the second source/drain connection electrode SDCE2 may be connected to the third drain connection electrode DCE3 through a sixteenth contact hole CT16 formed through the second interlayer insulating layer VA2. Further, the second source/drain connection electrode SDCE2 may include the repair short portion RSP, and the repair short portion RSP of the second source/drain connection electrode SDCE2 may overlap the repair short portion RSP of the fifth drain connection electrode DCE5.

The first gate extension electrode GEE1 may be connected to the second gate connection electrode GCE2 through a nineteenth contact hole CT19 formed through the second interlayer insulating layer VA2. Further, the first gate extension electrode GEE1 may include the repair short portion RSP, and the repair short portion RSP of the first gate extension electrode GEE1 may overlap the repair short portion RSP of the first gate line GL1 described above.

The second gate extension electrode GEE2 may be connected to the emission line EML through a fifteenth contact hole CT15 formed through the second interlayer insulating layer VA2. Further, the second gate extension electrode GEE2 may include the repair short portion RSP, and the repair short portion RSP of the second gate extension electrode GEE2 may overlap the repair short portion RSP of the third gate connection electrode GCE3 described above.

The source extension electrode SEE may be connected to the third source connection electrode SCE3 through a twentieth contact hole CT20 formed through the second interlayer insulating layer VA2. Further, the source extension electrode SEE may include the repair short portion RSP, and the repair short portion RSP of the source extension electrode SEE may overlap the repair short portion RSP of the second source connection electrode SCE2 described above.

The data line DL may be connected to the second source connection electrode SCE2 through a seventeenth contact hole CT17 formed through the second interlayer insulating layer VA2.

The upper driving voltage line VDLb may be connected to the lower driving voltage line VDLa through a twenty-eighth contact hole CT28 formed through the second interlayer insulating layer VA2. Further, the upper driving voltage line VDLb may include the repair short portion RSP, and the repair short portion RSP of the upper driving voltage line VDLb may overlap the repair short portion RSP of the fourth source connection electrode SCE4 described above.

The common voltage line VSL may be connected to the fourth drain connection electrode DCE4 through an eighteenth contact hole CT18 formed through the second interlayer insulating layer VA2.

FIGS. 13, 14, 15, and 16 are diagrams illustrating a repair method of a display device according to one embodiment.

Figure 13:
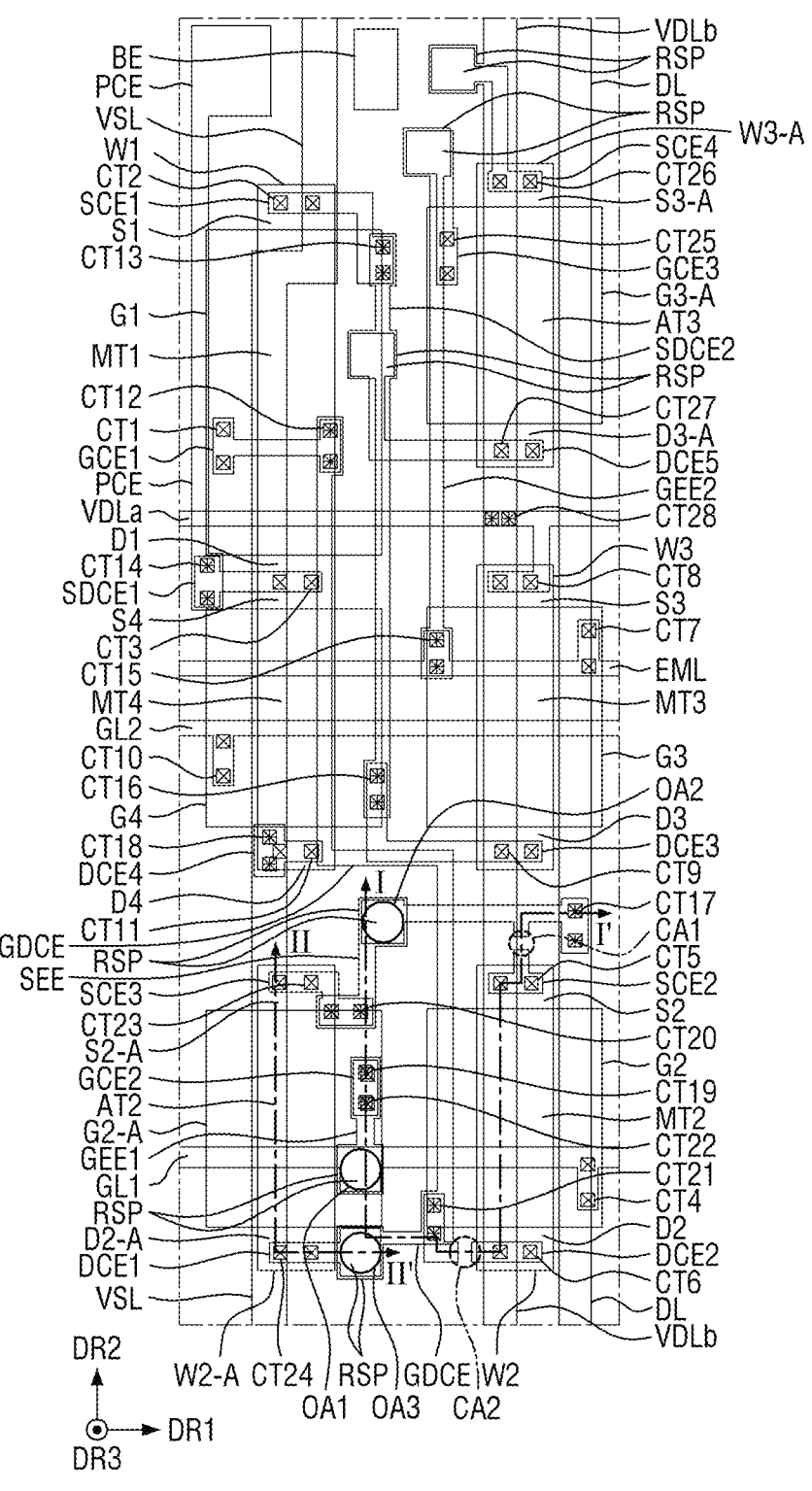
FIGS. 13, 14, 15, and 16 are diagrams illustrating a repair method of a display device according to one embodiment.
Figure 14:
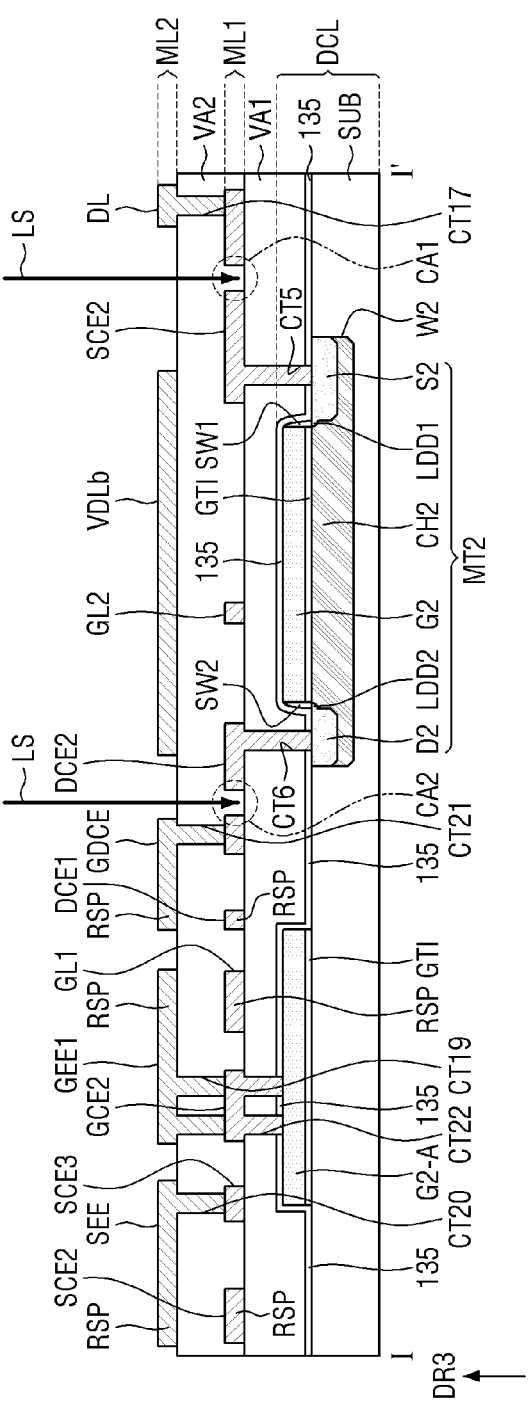

When the second main transistor MT2 is determined to be defective as a result of inspection of the second main transistor MT2, the connection between the second main transistor MT2 and the pixel circuit PC may be disconnected. As one example for this, as shown in FIGS. 13 and 14, the second source connection electrode SCE2 and the second drain connection electrode DCE2 may be disconnected by irradiating laser LS to the second source connection electrode SCE2 and the second drain connection electrode DCE2 of the second main transistor MT2, respectively. In other words, the second source connection electrode SCE2 may be disconnected such that the data line DL and the source electrode S2 of the second main transistor MT2 are separated, and the second drain connection electrode DCE2 may be disconnected such that the gate/drain connection electrode GDCE and the drain electrode D2 of the second main transistor MT2 are separated. For example, the second source connection electrode SCE2 is removed by the laser LS in a preset first disconnection area CA1 of the second source connection electrode SCE2 so that the electrical connection between the second source connection electrode SCE2 and the data line DL may be cut off. Further, the second drain connection electrode DCE2 is removed by the laser LS in a preset second disconnection area CA2 of the second drain connection electrode DCE2 so that the electrical connection between the second drain connection electrode DCE2 and the gate/drain connection electrodes GDCE may be cut off. Accordingly, the second source electrode S2 and the second drain electrode D2 of the second main transistor MT2 may be electrically separated from the data line DL and the gate/drain connection electrode GDCE, respectively.

Figure 15:
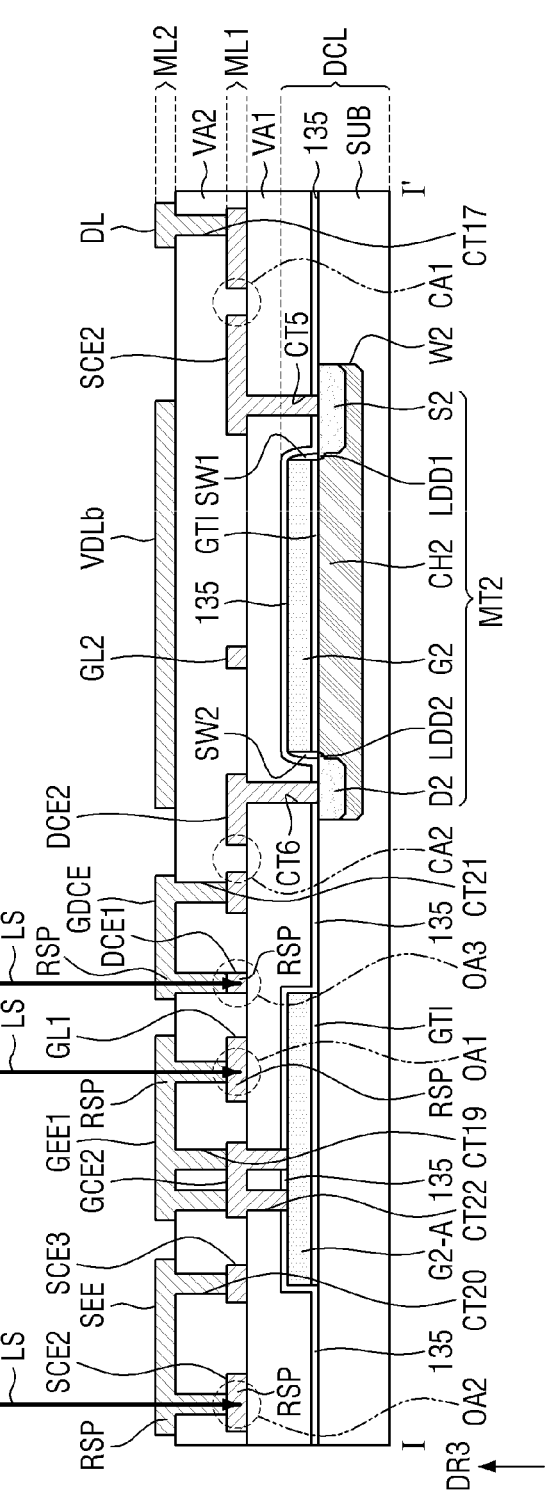
Figure 16:
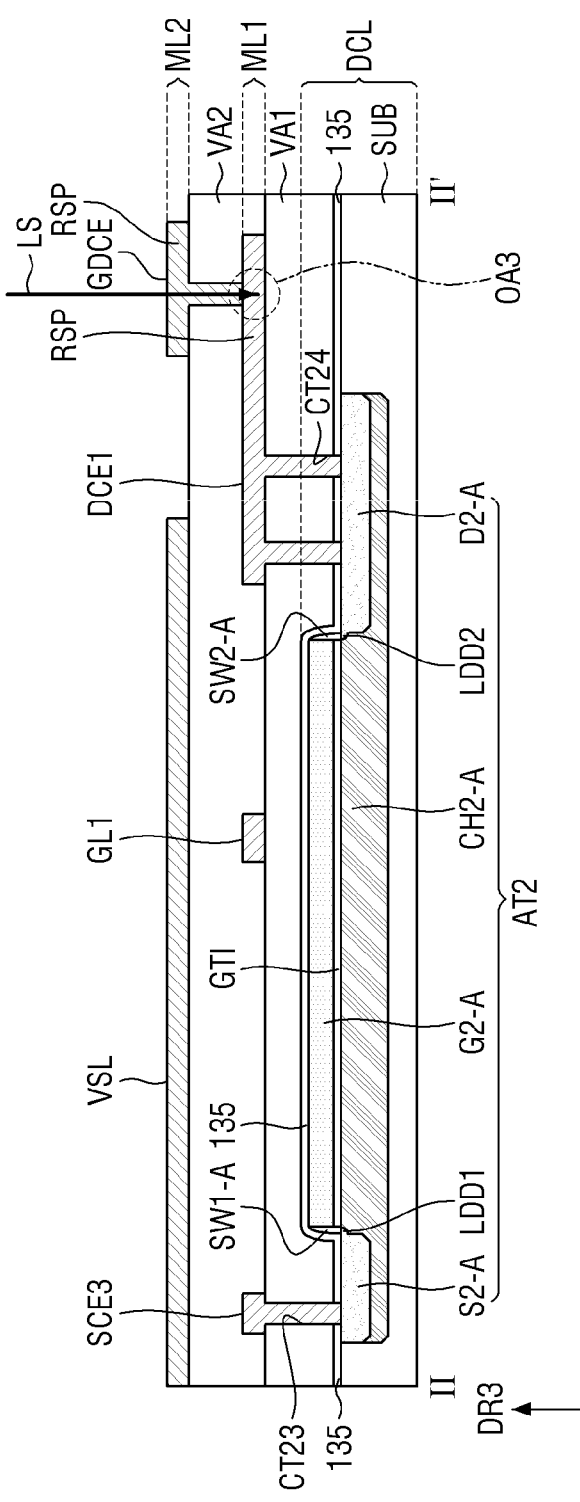

Next, the second auxiliary transistor AT2 may be connected to the pixel circuit PC. For example, as shown in FIGS. 13, 15, and 16, by irradiating the laser LS to the repair short portion RSP of the first gate extension electrode GEE1, the repair short portion RSP of the source extension electrode SEE, and the repair short portion RSP of the gate/drain connection electrode GDCE, the repair short portion RSP of the first gate extension electrode GEE1 and the repair short portion RSP of the first gate line GL1 disposed thereunder may be in contact with each other at a first overlapping area OA1 thereof, the repair short portion RSP of the source extension electrode SEE and the repair short portion RSP of the second source connection electrode SCE2 disposed thereunder may be in contact with each other at a second overlapping area OA2 thereof, and the repair short portion RSP of the gate/drain connection electrode GDCE and the repair short portion RSP of the first drain connection electrode DCE1 disposed thereunder may be in contact with each other at a third overlapping area OA3 thereof. Accordingly, the first gate extension electrode GEE1 and the first gate line GL1 may be electrically connected, the source extension electrode SEE and the second source connection electrode SCE2 may be electrically connected, and the gate/drain connection electrode GDCE and the first drain connection electrode DCE1 may be electrically connected. Therefore, the second gate electrode G2-A of the second auxiliary transistor AT2 may be connected to the first gate line GL1, the second source electrode S2-A of the second auxiliary transistor AT2 may be connected to the data line DL, and the second drain electrode D2-A of the second auxiliary transistor AT2 may be connected to the gate/drain connection electrode GDCE.

Figure 17A:
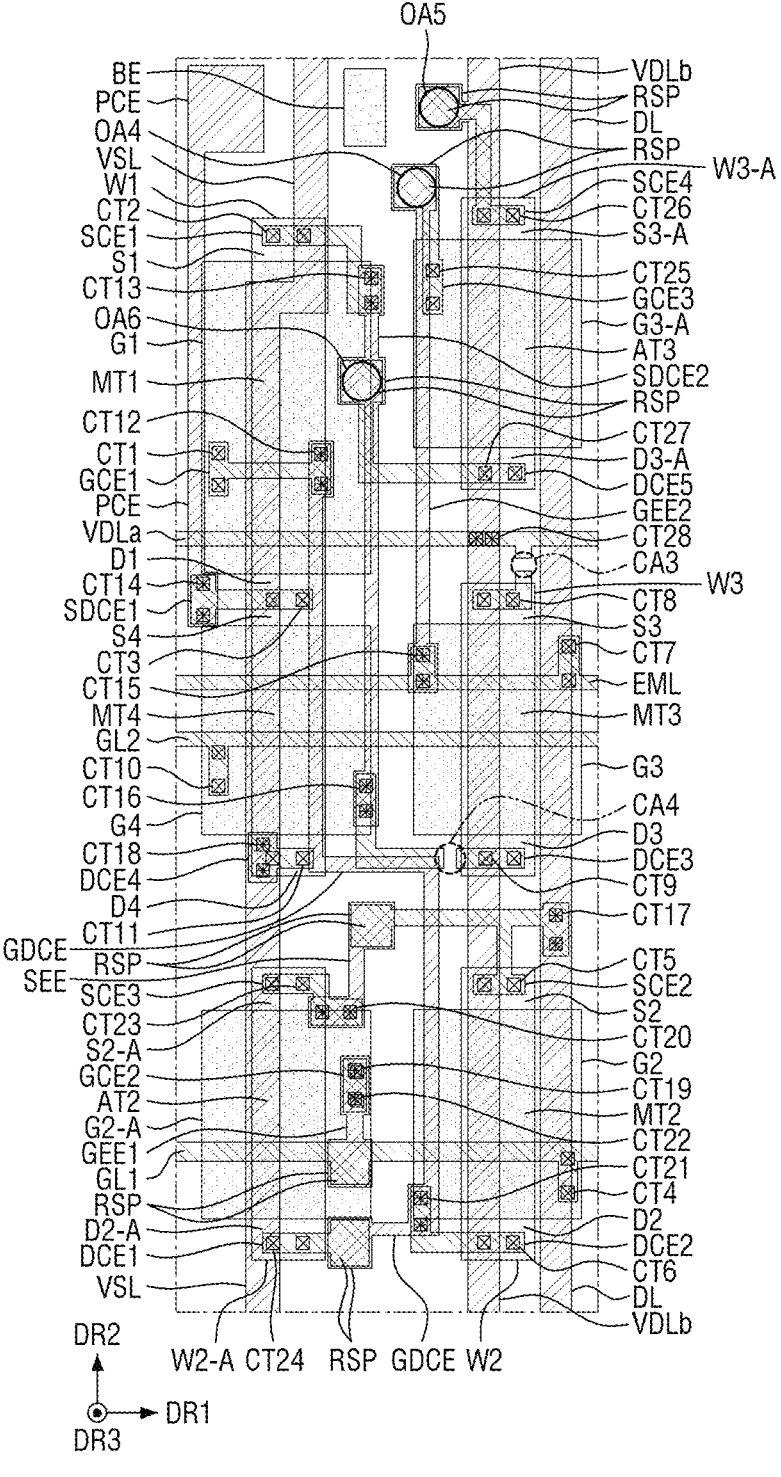
FIG. 17A is a diagram illustrating a repair method of a display device and FIG. 17B is a circuit diagram of one pixel of a display device after the third main transistor MT3 is repaired according to one embodiment.
Figure 17B:
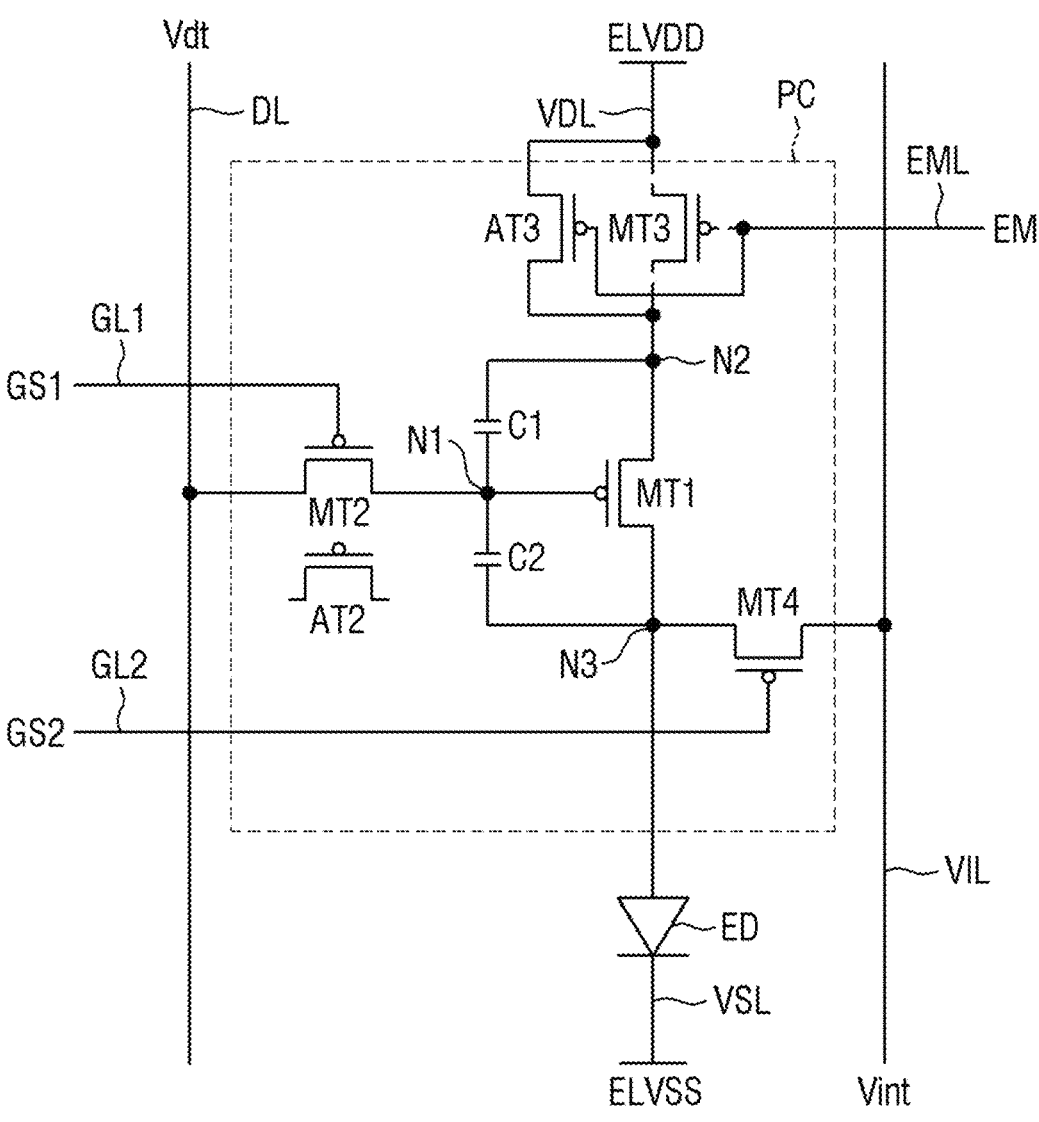

FIG. 17A is a diagram illustrating a repair method of a display device and FIG. 17B is a circuit diagram of one pixel of a display device after the third main transistor MT3 is repaired according to one embodiment.

When the third main transistor MT3 is determined to be defective as a result of inspection of the third main transistor MT3, the connection between the third main transistor MT3 and the pixel circuit PC may be disconnected. As one example for this, as shown in FIG. 17A, the lower driving voltage line VDLa and the third drain connection electrode DCE3 may be disconnected by irradiating the laser LS to the lower driving voltage line VDLa and the third drain connection electrode DCE3, respectively. In other words, the lower driving voltage line VDLa may be disconnected such that the lower driving voltage line VDLa and the source electrode S3 of the third main transistor MT3 are separated, and the third drain connection electrode DCE3 may be disconnected such that the second source/drain connection electrode SDCE2 and the drain electrode D3 of the third main transistor MT3 are separated. For example, the lower driving voltage line VDLa is removed by the laser LS in a preset third disconnection area CA3 of the lower driving voltage line VDLa so that the electrical connection between the lower driving voltage line VDLa and the third source electrode S3 of the third main transistor MT3 may be cut off. Further, the third drain connection electrode DCE3 is removed by the laser LS in a preset fourth disconnection area CA4 of the third drain connection electrode DCE3 so that the electrical connection between the third drain connection electrode DCE3 and the second source/drain connection electrode SDCE2 may be cut off. Accordingly, the third source electrode S3 and the third drain electrode D3 of the third main transistor MT3 may be electrically separated from the lower driving voltage line VDLa and the second source/drain connection electrode SDCE2, respectively.

Next, the third auxiliary transistor AT3 may be connected to the pixel circuit PC. For example, as shown in FIG. 17A, by irradiating the laser LS to the repair short portion RSP of the second gate extension electrode GEE2, the repair short portion RSP of the upper driving voltage line VDLb, and the repair short portion RSP of the second source/drain connection electrode SDCE2, the repair short portion RSP of the second gate extension electrode GEE2 and the repair short portion RSP of the third gate connection electrode GCE3 disposed thereunder may be in contact with each other at a fourth overlapping area OA4 thereof, the repair short portion RSP of the upper driving voltage line VDLb and the repair short portion RSP of the fourth source connection electrode SCE4 disposed thereunder may be in contact with each other at a fifth overlapping area OA5 thereof, and the repair short portion RSP of the second source/drain connection electrode SDCE2 and the repair short portion RSP of the fifth drain connection electrode DCE5 disposed thereunder may be in contact with each other at a sixth overlapping area OA6 thereof. Accordingly, the second gate extension electrode GEE2 and the third gate connection electrode GCE3 may be electrically connected, the upper driving voltage line VDLb and the fourth source connection electrode SCE4 may be electrically connected, and the second source/drain connection electrode SDCE2 and the fifth drain connection electrode DCE5 may be electrically connected. Therefore, the third gate electrode G3-A of the third auxiliary transistor AT3 may be connected to the emission line EML, the third source electrode S3-A of the third auxiliary transistor AT3 may be connected to the upper driving voltage line VDLb, and the third drain electrode D3-A of the third auxiliary transistor AT3 may be connected to the second source/drain connection electrode SDCE2.

Meanwhile, the aforementioned disconnection areas CA1, CA2, CA3, and CA4 and the overlapping areas OA1, OA2, OA3, OA4, OA5, and OA6 may not overlap each other.

Figure 18:
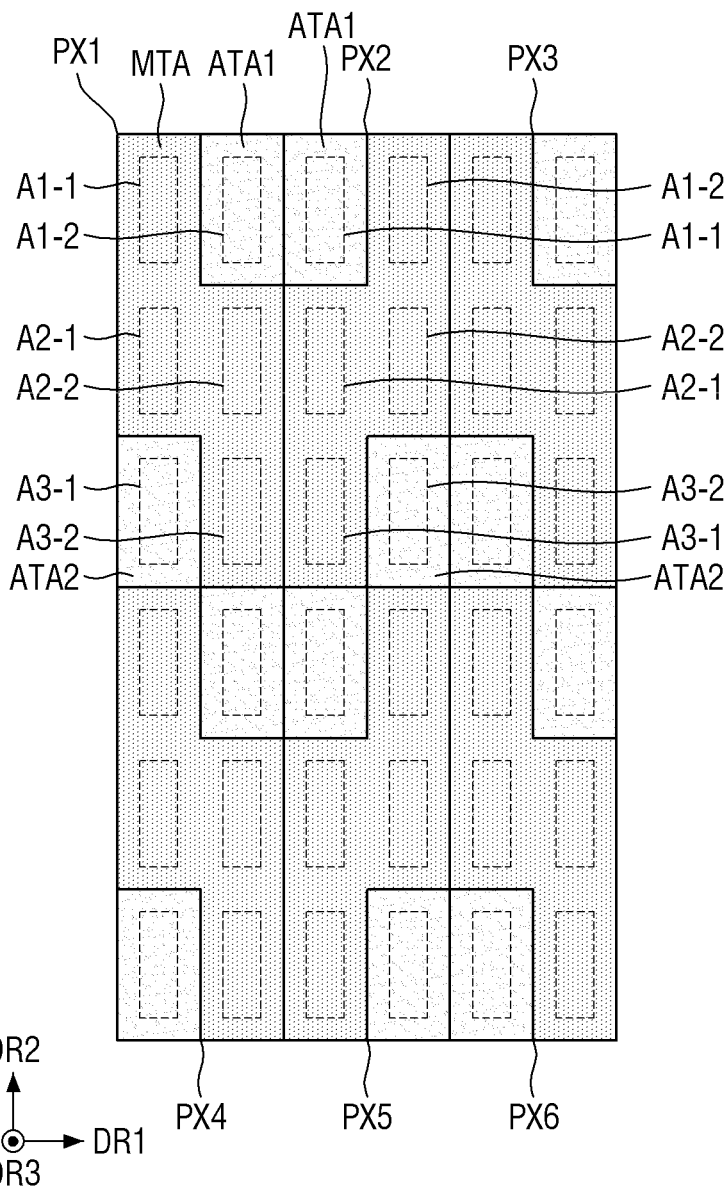
FIG. 18 is a plan view of a display device according to one embodiment.

FIG. 18 is a plan view of a display device according to one embodiment.

As shown in FIG. 18, the display device may include a plurality of pixels PX1, PX2, PX3, PX4, PX5, and PX6. The plurality of pixels PX1, PX2, PX3, PX4, PX5, and PX6 may be arranged in the first direction DR1 and the second direction DR2.

The display device of FIG. 18 is different from the display device of FIG. 8 in that transistors of adjacent pixels are arranged differently, and the difference will be mainly described below.

As shown in FIG. 18, the transistors of pixels adjacent in the first direction DR1 may be arranged differently. For example, the first pixel PX1 and the second pixel PX2 may include differently arranged transistors. This will be described in detail below.

The first main transistor MT1 of the first pixel PX1 may be disposed in the first-first transistor area A1-1 corresponding to the first column of the first row.

The second main transistor MT2 of the first pixel PX1 may be disposed in the third-second transistor area A3-2 corresponding to the second column of the third row.

The third main transistor MT3 of the first pixel PX1 may be disposed in the second-second transistor area A2-2 corresponding to the second column of the second row.

The fourth main transistor MT4 of the first pixel PX1 may be disposed in the second-first transistor area A2-1 corresponding to the first column of the second row.

The second auxiliary transistor AT2 of the first pixel PX1 may be disposed in the third-first transistor area A3-1 corresponding to the first column of the third row.

The third auxiliary transistor AT3 of the first pixel PX1 may be disposed in the first-second transistor area A1-2 corresponding to the second column of the first row.

The first main transistor MT1 of the second pixel PX2 may be disposed in the first-second transistor area A1-2 corresponding to the second column of the first row.

The second main transistor MT2 of the second pixel PX2 may be disposed in the third-first transistor area A3-1 corresponding to the first column of the third row.

The third main transistor MT3 of the second pixel PX2 may be disposed in the second-first transistor area A2-1 corresponding to the first column of the second row.

The fourth main transistor MT4 of the second pixel PX2 may be disposed in the second-second transistor area A2-2 corresponding to the second column of the second row.

The second auxiliary transistor AT2 of the second pixel PX2 may be disposed in the third-second transistor area A3-2 corresponding to the second column of the third row.

The third auxiliary transistor AT3 of the second pixel PX2 may be disposed in the first-first transistor area A1-1 corresponding to the first column of the first row.

Figure 19:
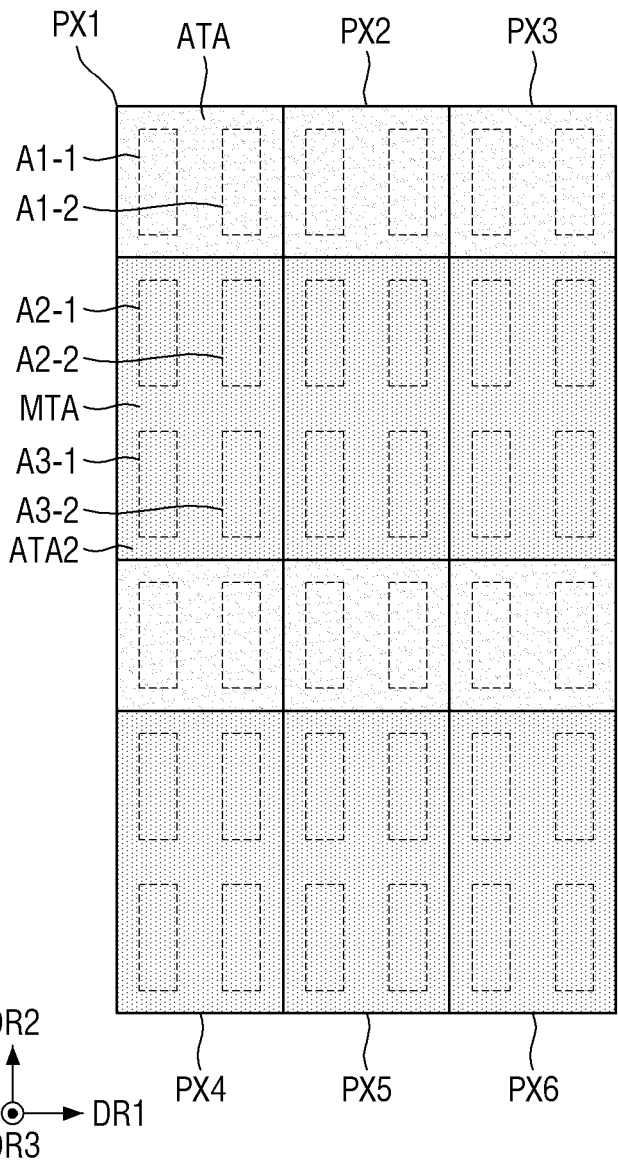
FIG. 19 is a plan view of a display device according to one embodiment.

FIG. 19 is a plan view of a display device according to one embodiment.

As shown in FIG. 19, the display device may include a plurality of pixels PX1, PX2, PX3, PX4, PX5, and PX6. The plurality of pixels PX1, PX2, PX3, PX4, PX5, and PX6 may be arranged in the first direction DR1 and the second direction DR2.

Each of the pixel PX1, PX2, PX3, PX4, PX5, and PX6 may include six transistor areas disposed in three rows and two columns. For example, the first pixel may include the first-first transistor area A1-1, the first-second transistor area A1-2, the second-first transistor area A2-1, the second-second transistor area A2-2, the third-first transistor area A3-1, and the third-second transistor area A3-2 disposed in three rows and two columns.

The first main transistor MT1 may be disposed in the third-first transistor area A3-1 corresponding to the first column of the third row.

The second main transistor MT2 may be disposed in the second-first transistor area A2-1 corresponding to the first column of the second row.

The third main transistor MT3 may be disposed in the second-second transistor area A2-2 corresponding to the second column of the second row.

The fourth main transistor MT4 may be disposed in the third-second transistor area A3-2 corresponding to the second column of the third row.

The second auxiliary transistor AT2 may be disposed in the first-first transistor area A1-1 corresponding to the first column of the first row.

The third auxiliary transistor AT3 may be disposed in the first-second transistor area A1-2 corresponding to the second column of the first row.

When the area including the second-first transistor area A2-1, the second-second transistor area A2-2, the third-first transistor area A3-1, and the third-second transistor area A3-2 is defined as the main transistor area MTA, the main transistor area MTA may have a quadrilateral shape.

When the area including the first-first transistor area A1-1 and the first-second transistor area A1-2 is defined as the auxiliary transistor area ATA, the auxiliary transistor area ATA may have a quadrilateral shape.

Figure 20:
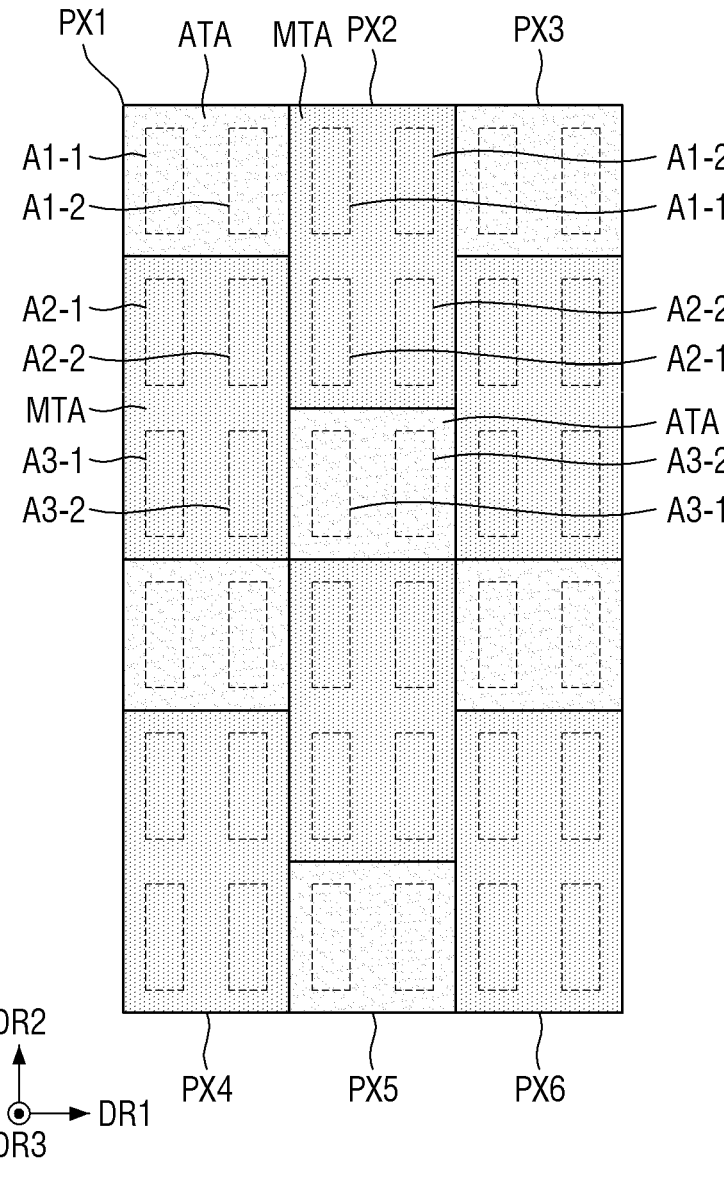
FIG. 20 is a plan view of a display device according to one embodiment.

FIG. 20 is a plan view of a display device according to one embodiment.

As shown in FIG. 20, the display device may include a plurality of pixels PX1, PX2, PX3, PX4, PX5, and PX6. The plurality of pixels PX1, PX2, PX3, PX4, PX5, and PX6 may be arranged in the first direction DR1 and the second direction DR2.

The display device of FIG. 20 is different from the display device of FIG. 19 in that transistors of adjacent pixels are arranged differently, and the difference will be mainly described below.

As shown in FIG. 20, transistors of pixels adjacent in the first direction DR1 may be arranged differently. For example, the first pixel and the second pixel may include differently arranged transistors. This will be described in detail below.

The first main transistor MT1 of the first pixel PX1 may be disposed in the third-first transistor area A3-1 corresponding to the first column of the third row.

The second main transistor MT2 of the first pixel PX1 may be disposed in the second-first transistor area A2-1 corresponding to the first column of the second row.

The third main transistor MT3 of the first pixel PX1 may be disposed in the second-second transistor area A2-2 corresponding to the second column of the second row.

The fourth main transistor MT4 of the first pixel PX1 may be disposed in the third-second transistor area A3-2 corresponding to the second column of the third row.

The second auxiliary transistor AT2 of the first pixel PX1 may be disposed in the first-first transistor area A1-1 corresponding to the first column of the first row.

The third auxiliary transistor AT3 of the first pixel PX1 may be disposed in the first-second transistor area A1-2 corresponding to the second column of the first row.

The first main transistor MT1 of the second pixel PX2 may be disposed in the first-second transistor area A1-2 corresponding to the second column of the first row.

The second main transistor MT2 of the second pixel PX2 may be disposed in the second-second transistor area A2-2 corresponding to the second column of the second row.

The third main transistor MT3 of the second pixel PX2 may be disposed in the second-first transistor area A2-1 corresponding to the first column of the second row.

The fourth main transistor MT4 of the second pixel PX2 may be disposed in the first-first transistor area A1-1 corresponding to the first column of the first row.

The second auxiliary transistor AT2 of the second pixel PX2 may be disposed in the third-second transistor area A3-2 corresponding to the second column of the third row.

The third auxiliary transistor AT3 of the second pixel PX2 may be disposed in the third-first transistor area A3-1 corresponding to the first column of the third row.

Figure 21:
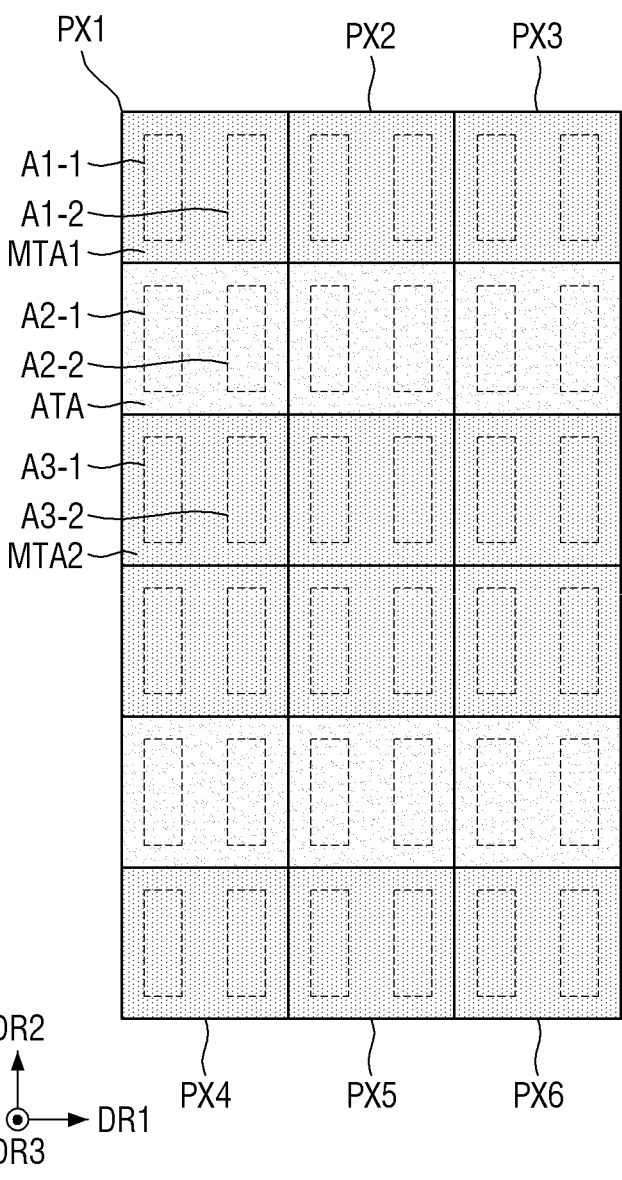
FIG. 21 is a plan view of a display device according to one embodiment.

FIG. 21 is a plan view of a display device according to one embodiment.

As shown in FIG. 21, the display device may include a plurality of pixels PX1, PX2, PX3, PX4, PX5, and PX6. The plurality of pixels PX1, PX2, PX3, PX4, PX5, and PX6 may be arranged in the first direction DR1 and the second direction DR2.

Each of the pixel PX1, PX2, PX3, PX4, PX5, and PX6 may include six transistor areas defined by three rows and two columns. For example, the first pixel may include the first-first transistor area A1-1, the first-second transistor area A1-2, the second-first transistor area A2-1, the second-second transistor area A2-2, the third-first transistor area A3-1, and the third-second transistor area A3-2 disposed in three rows and two columns.

The first main transistor MT1 may be disposed in the first-first transistor area A1-1 corresponding to the first column of the first row.

The second main transistor MT2 may be disposed in the first-second transistor areas A1-2 corresponding to the second column of the first row.

The third main transistor MT3 may be disposed in the third-first transistor area A3-1 corresponding to the first column of the third row.

The fourth main transistor MT4 may be disposed in the third-second transistor area A3-2 corresponding to the second column of the third row.

The second auxiliary transistor AT2 may be disposed in the second-second transistor area A2-2 corresponding to the second column of the second row.

The third auxiliary transistor AT3 may be disposed in the second-first transistor area A2-1 corresponding to the first column of the second row.

When the area including the first-first transistor area A1-1 and the first-second transistor area A1-2 is defined as the first main transistor area MTA1, the first main transistor area MTA1 may have a quadrangular shape.

When the area including the third-first transistor area A3-1 and the third-second transistor area A3-2 is defined as the second main transistor area MTA2, the second main transistor area MTA2 may have a quadrangular shape.

When the area including the second-first transistor area A2-1 and the second-second transistor area A2-2 is defined as the auxiliary transistor area ATA, the auxiliary transistor area ATA may have a quadrilateral shape.

Figure 22:
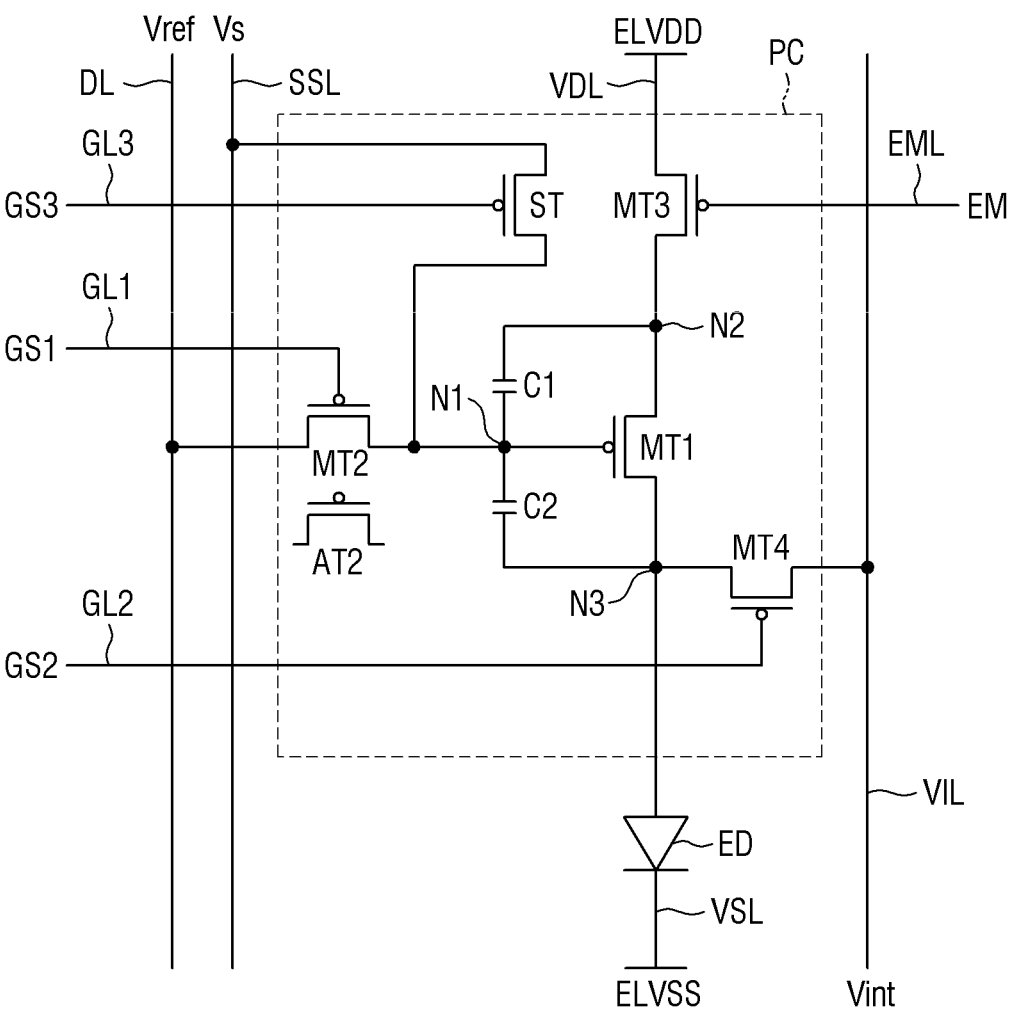
FIG. 22 is a circuit diagram of one pixel of a display device according to one embodiment.

FIG. 22 is a circuit diagram of one pixel of a display device according to one embodiment.

As shown in FIG. 22, the pixel PX may be connected to the first gate line GL1, the second gate line GL2, the third gate line GL3, the emission line EML, the initialization line VIL, the data line DL, a sensing line SSL, the driving voltage line VDL, and the common voltage line VSL. Here, the common voltage line VSL may be connected to the common electrode (e.g., cathode electrode) of the light emitting element ED.

The pixel PX may include a pixel circuit PC and the light emitting element ED.

The pixel circuit PC may include the first main transistor MT1, the second main transistor MT2, the third main transistor MT3, the fourth main transistor MT4, the second auxiliary transistor AT2, a sensing transistor ST, the first capacitor C1, and the second capacitor C2.

Since the first main transistor MT1, the second main transistor MT2, the third main transistor MT3, the fourth main transistor MT4, the second auxiliary transistor AT2, the first capacitor C1, and the second capacitor C2 of FIG. 22 are the same as the first main transistor MT1, the second main transistor MT2, the third main transistor MT3, the fourth main transistor MT4, the second auxiliary transistor AT2, the first capacitor C1, and the second capacitor C2 of FIG. 5 described above, respectively, the description of the first main transistor MT1, the second main transistor MT2, the third main transistor MT3, the fourth main transistor MT4, the second auxiliary transistor AT2, the first capacitor C1, and the second capacitor C2 of FIG. 22 refer to FIG. 5 and related description.

The sensing transistor ST may be turned on by a third gate signal GS3 of the third gate line GL3 to electrically connect the first node N1 and the sensing line SSL. The gate electrode of the sensing transistor ST may be electrically connected to the third gate line GL3, the source electrode thereof may be electrically connected to the first node N1, and the drain electrode thereof may be electrically connected to the sensing line SSL.

For example, the sensing transistor ST may maintain a turn-on state during the turn-on period of the second main transistor MT2. In other words, a period in which the third gate signal GS3, which is applied to the gate electrode of the sensing transistor ST, is maintained at an active level may be the same as a period in which the second gate signal GS2, which is applied to the gate electrode of the second main transistor MT2, is maintained at an active level.

For example, the reference voltage Vref may be applied to the data line DL during the turn-on period of the sensing transistor ST. Therefore, the current flowing from the data line DL to the sensing line SSL may be detected by the turned-on sensing transistor ST. The detected current (hereinafter, referred to as a sensing current) may be supplied to a detector through the sensing line SSL. The detector may determine whether or not the second main transistor MT2 is defective based on the supplied sensing current. For example, the detector may convert the sensing current supplied through the sensing line SSL into a voltage (for example, a sensing voltage Vs), compare the sensing voltage Vs with a preset determination voltage, and determine whether or not the second main transistor MT2 is defective based on the comparison result. For example, when it is confirmed that the sensing voltage Vs is within a predetermined normal range of the determination voltage as a result of comparison, the detector may determine that there is no abnormality in the second main transistor MT2. For a specific example, the determination voltage may have a lower limit voltage and an upper limit voltage, and the detector may determine that the second main transistor MT2 is normal when the sensing voltage Vs is higher than or equal to the lower limit voltage of the determination voltage and lower than or equal to the upper limit voltage of the determination voltage. On the other hand, when the sensing voltage Vs is not within the normal range of the determination voltage as a result of comparison, the detector may determine that the second main transistor MT2 is abnormal. For a specific example, when the sensing voltage Vs is lower than the lower limit voltage or higher than the upper limit voltage of the determination voltage, the detector may determine that the second main transistor MT2 is abnormal. In other words, the detector may determine the second main transistor MT2 as a defective transistor.

In one embodiment, in order to perform defect inspection of the third main transistor MT3, for example, another sensing transistor (hereinafter, referred to as a second sensing transistor) may be connected between the second node N2 and another sensing line (hereinafter, referred to as a second sensing line). For example, the gate electrode of the second sensing transistor may be connected to the third gate line GL3, the source electrode of the second sensing transistor may be connected to the second node N2, and the drain electrode of the second sensing transistor may be connected to the second sensing line SSL.

Meanwhile, after the defect inspection of the main transistor, the repair process shown in FIGS. 13 to 17 may be performed. However, if there is no abnormality in the main transistors, the above-described repair process may be omitted.

After the repair process or the defect inspection process, the sensing transistor ST of FIG. 22 may be constantly maintained in a turn-off state. As one example for this, the third gate signal GS3 of the third gate line GL3 connected to the gate electrode of the sensing transistor ST may be maintained at a non-active level regardless of periods. In other words, the third gate signal GS3 may be a DC signal having a level capable of turning off the sensing transistor ST.

Further, after the repair process or the defect inspection process, the aforementioned data voltage Vdt may be applied to the data line DL of FIG. 22. After the repair process or the defect inspection process, the signals shown in FIG. 6 may be applied to the pixel circuit PC of FIG. 22. In other words, after the repair process or the defect inspection process, the pixel circuit PC of FIG. 22 may operate based on the signals and the timing diagram of FIG. 6.

Figure 23:
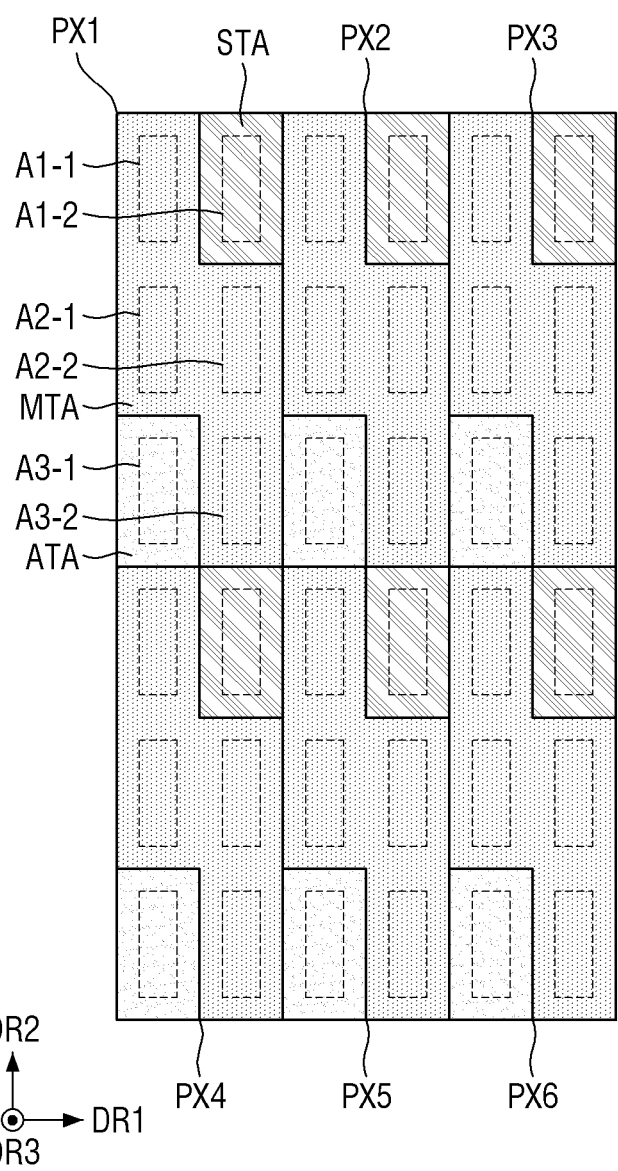
FIG. 23 is a plan view of a display device according to one embodiment.

FIG. 23 is a plan view of a display device according to one embodiment.

As shown in FIG. 23, the display device may include a plurality of pixels PX1, PX2, PX3, PX4, PX5, and PX6. The plurality of pixels PX1, PX2, PX3, PX4, PX5, and PX6 may be arranged in the first direction DR1 and the second direction DR2.

Each pixel may include six transistor areas disposed in three rows and two columns. For example, the first pixel may include the first-first transistor area A1-1, the first-second transistor area A1-2, the second-first transistor area A2-1, the second-second transistor area A2-2, the third-first transistor area A3-1, and the third-second transistor area A3-2 disposed in three rows and two columns.

The first main transistor MT1 may be disposed in the first-first transistor area A1-1 corresponding to the first column of the first row.

The second main transistor MT2 may be disposed in the third-second transistor area A3-2 corresponding to the second column of the third row.

The third main transistor MT3 may be disposed in the second-second transistor area A2-2 corresponding to the second column of the second row.

The fourth main transistor MT4 may be disposed in the second-first transistor area A2-1 corresponding to the first column of the second row.

The second auxiliary transistor AT2 may be disposed in the third-first transistor area A3-1 corresponding to the first column of the third row.

The sensing transistor ST may be disposed in the first-second transistor area A1-2 corresponding to the second column of the first row.

When the area including the first-first transistor area A1-1, the second-first transistor area A2-1, the second-second transistor area A2-2, and the third-second transistor area A3-2 is defined as the main transistor area MTA, the main transistor area MTA may have a bent shape.

The first-second transistor area A1-2 may be the sensing transistor area ST, and the third-first transistor area A3-1 may be the auxiliary transistor area ATA.

Figure 24:
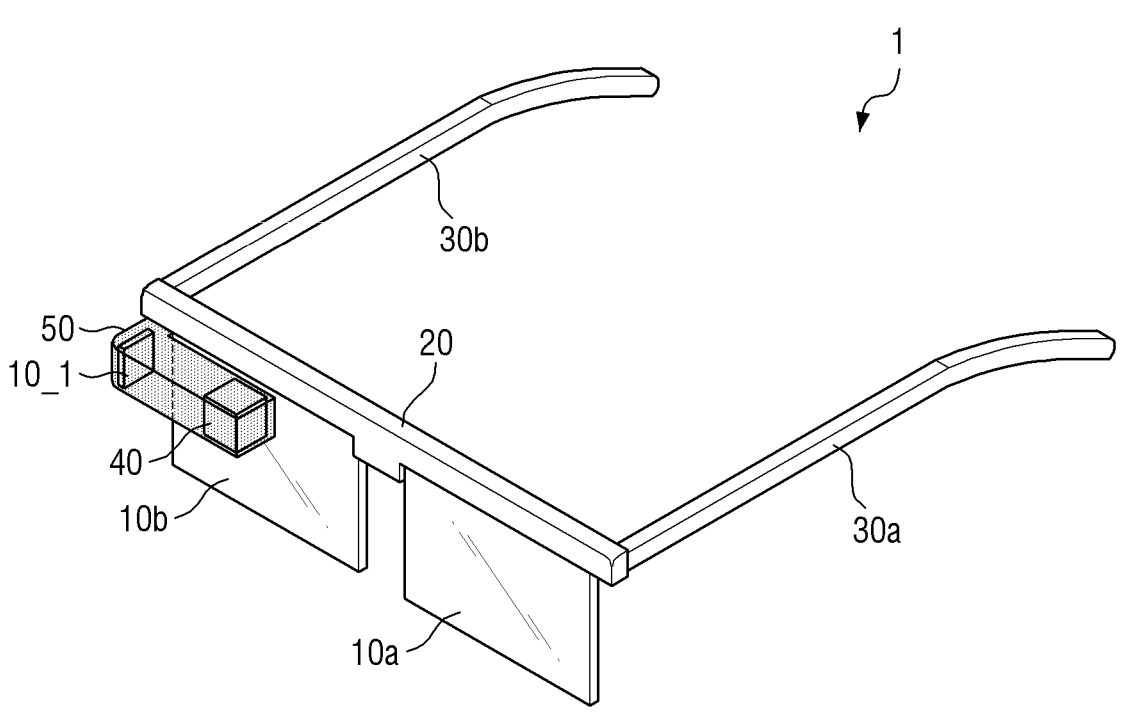
FIG. 24 is an exemplary diagram illustrating a virtual reality device including a display device according to one embodiment.

FIG. 24 is an exemplary diagram illustrating a virtual reality device including a display device according to one embodiment. FIG. 24 illustrates a virtual reality device 1 to which a display device 10_1 according to one embodiment is applied. Here, the display device 10_1 may be, for example, a display device including the components of FIGS. 1 to 23 described above.

Referring to FIG. 24, the virtual reality device 1 according to one embodiment may be a glass-type device. The virtual reality device 1 according to one embodiment may include the display device 10_1, a left lens 10a, a right lens 10b, a support frame 20, temples 30a and 30b, a reflection member 40, and a display device housing 50.

Although FIG. 24 illustrates the virtual reality device 1 including the temples 30a and 30b, the virtual reality device 1 according to one embodiment may be applied to a head mounted display including a head mounted band that may be worn on a head, instead of the temples 30a and 30b. That is, the virtual reality device 1 according to one embodiment is not limited to that shown in FIG. 24, and may be applied in various forms to various electronic devices.

The display device housing 50 may include the display device 10_1 and the reflection member 40. The image displayed on the display device 10_1 may be reflected by the reflection member 40 and provided to a user's right eye through the right lens 10b. Accordingly, the user can view the virtual reality image displayed on the display device 10_1 through the right eye.

Although FIG. 24 illustrates that the display device housing 50 is disposed at the right end of the support frame 20, the embodiment of the present specification is not limited thereto. For example, the display device housing 50 may be disposed at the left end of the support frame 20, and in this case, the image displayed on the display device 10_1 may be reflected by the reflection member 40 and provided to a user's left eye through the left lens 10a. Accordingly, the user can view the virtual reality image displayed on the display device 10_1 through the left eye. Alternatively, the display device housing 50 may be disposed at both the left end and the right end of the support frame 20. In that case, the user can view the virtual reality image displayed on the display device 10_1 through both the left eye and the right eye.

Figure 25:
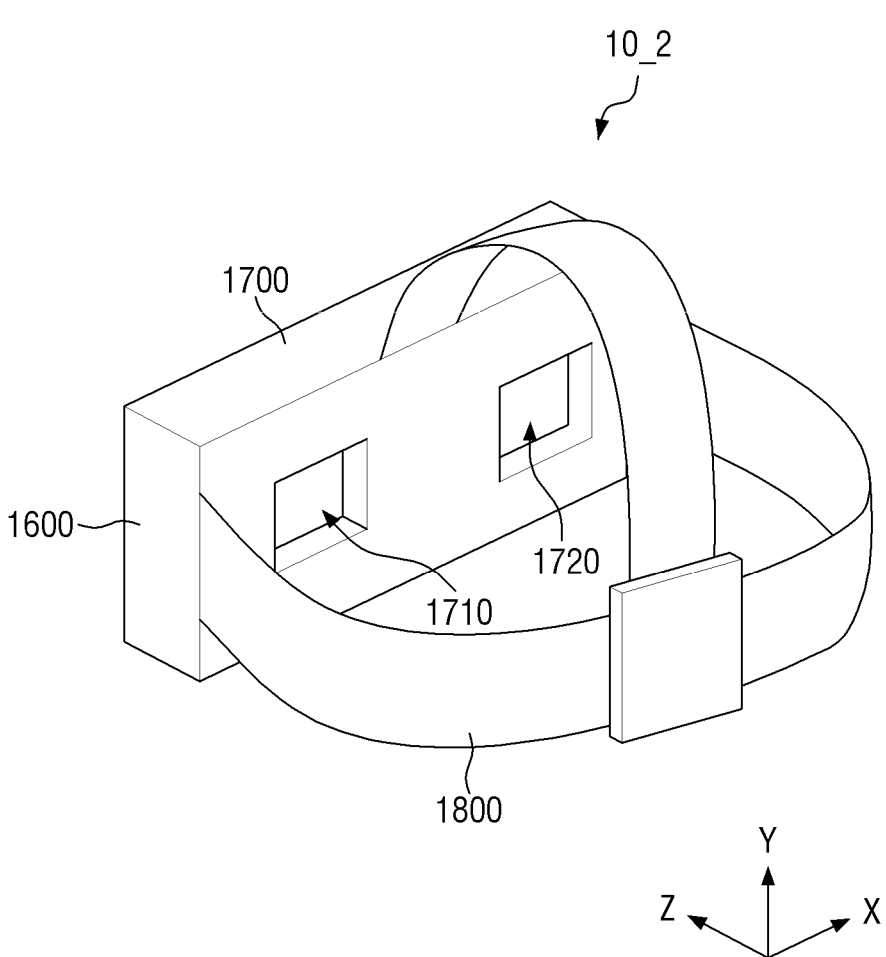
FIGS. 25 and 26 are exemplary views illustrating a head mounted display device to which a display device according to one embodiment is applied.
Figure 26:
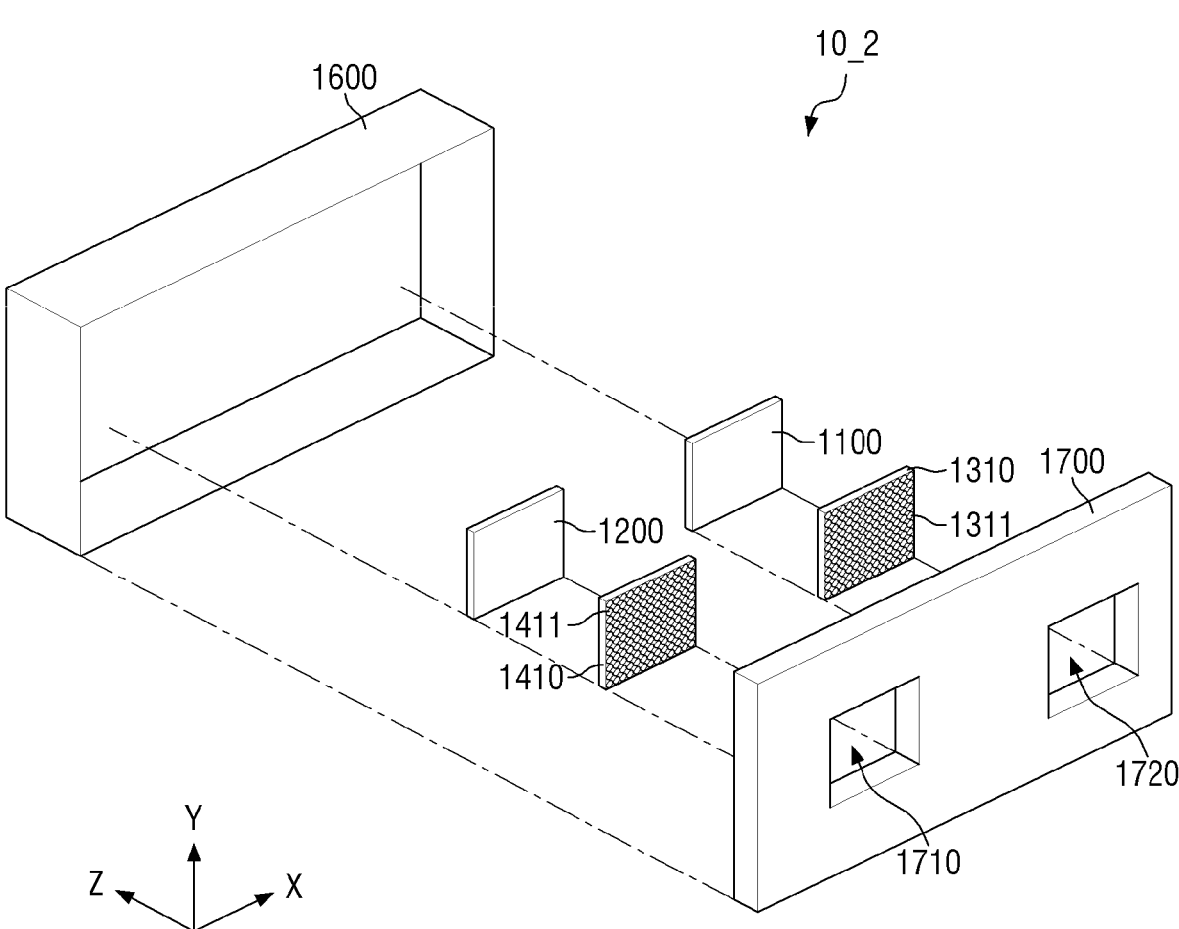

FIGS. 25 and 26 are exemplary views illustrating a head mounted display device to which a display device according to one embodiment is applied.

Referring to FIGS. 25 and 26, the display device 10_2 according to one embodiment may be applied to a head mounted display. A first display device 1100 provides an image to the user's right eye, and a second display device 1200 provides an image to the user's left eye.

Here, the display device 10_2 may be, for example, a display device including the components of FIGS. 1 to 23 described above.

A first lens array 1310 may be disposed between the first display device 1100 and a housing cover 1700. The first lens array 1310 may include a plurality of lenses 1311. The plurality of lenses 1311 may be formed as convex lenses that are convex in the direction toward the housing cover 1700.

A second lens array 1410 may be disposed between the second display device 1200 and the housing cover 1700. The second lens array 1410 may include a plurality of lenses 1411. The plurality of lenses 1411 may be formed as convex lenses that are convex in the direction toward the housing cover 1700.

A display panel housing 1600 serves to accommodate the first display device 1100, the second display device 1200, the first lens array 1310, and the second lens array 1410. One surface of the display panel housing 1600 may be opened to accommodate the first display device 1100, the second display device 1200, the first lens array 1310, and the second lens array 1410.

The housing cover 1700 is disposed to cover the opened surface of the display panel housing 1600. The housing cover 1700 may include a first opening 1710 where the user's left eye is positioned and a second opening 1720 where the user's right eye is positioned. FIGS. 25 and 26 illustrate that the first opening 1710 and the second opening 1720 are formed in a rectangular shape, but the present disclosure is not limited thereto. The first opening 1710 and the second opening 1720 may be formed in a circular shape or an elliptical shape. Alternatively, the first opening 1710 and the second opening 1720 may be combined to be formed as one opening.

The first opening 1720 may be aligned with the first display device 1100 and the first lens array 1310, and the second opening 1710 may be aligned with the second display device 1200 and the second lens array 1410. Accordingly, the user may view an image of the first display device 1100, which is a virtual image enlarged by the first lens array 1310, through the first opening 1720, and an image of the second display device 1200, which is a virtual image enlarged by the second lens array 1410, through the second opening 1710.

A head mounting band 1800 functions to fix the display panel housing 1600 to the user's head so that the first opening 1710 and the second opening 1720 of the housing cover 1700 are positioned above the user's left and right eyes, respectively. The head mounting band 1800 may be connected to the top, left and right surfaces of the display panel housing 1600.

In concluding the detailed description, those skilled in the art will appreciate that many variations and modifications can be made to the preferred embodiments without substantially departing from the principles of the present inventive concept. Therefore, the disclosed preferred embodiments of the inventive concept are used in a generic and descriptive sense only and not for purposes of limitation.

What is claimed is:

1. A display device comprising:
   a pixel comprising a light emitting element and a pixel circuit connected to the light emitting element; and
   a signal line connected to the pixel,
   wherein the signal line comprises a gate line, an emission line, and a data line,
   wherein the pixel circuit comprises:
   a first main transistor connected between a driving voltage line and an anode electrode of the light emitting element,
   a second main transistor connected between the data line and a gate electrode of the first main transistor,
   a third main transistor connected between the driving voltage line and a source electrode of the first main transistor,
   a fourth main transistor connected between a drain electrode of the first main transistor and a common voltage line, and
   at least one auxiliary transistor disposed adjacent to at least one of the first to fourth main transistors, a gate electrode, a source electrode and a drain electrode of the at least one auxiliary transistor have a floating state before repairing, and
   wherein, after repairing, the gate electrode, the source electrode and the drain electrode of the at least one auxiliary transistor are connected to conductive lines in which a gate electrode, a source electrode and a drain electrode of at least one of the first to fourth main transistors were previously connected, respectively before repairing;
   a gate connection electrode connected to a gate electrode of the at least one auxiliary transistor; and
   a gate extension electrode disposed on a different layer from the gate connection electrode, and connected to the gate connection electrode,
   wherein a repair short portion of the gate extension electrode overlaps a repair short portion of the gate line.

2. The display device of claim 1, wherein the at least one auxiliary transistor is disposed adjacent to the corresponding main transistor.

3. The display device of claim 1, wherein the at least one auxiliary transistor includes a second auxiliary transistor disposed adjacent to the second main transistor and a third auxiliary transistor disposed adjacent to the third main transistor.

4. The display device of claim 1, wherein, when the at least one auxiliary transistor is connected to conductive lines in which a gate electrode, a source electrode and a drain electrode of at least one of the first to fourth main transistors were previously connected, a source electrode and a drain electrode of the main transistor corresponding to the at least one auxiliary transistor have a floating state.

5. The display device of claim 4, wherein a gate electrode of the main transistor corresponding to the at least one auxiliary transistor is connected to one of a node of the pixel circuit and the signal line.

6. The display device of claim 1, wherein the gate extension electrode is disposed over the gate connection electrode and the gate line.

7. The display device of claim 1, wherein the repair short portion of the gate extension electrode and the repair short portion of the gate line are in contact with each other.

8. The display device of claim 1, wherein a gate electrode of the main transistor corresponding to the at least one auxiliary transistor is connected to the gate line.

9. The display device of claim 1, further comprising a source connection electrode connected to a source electrode of the at least one auxiliary transistor, wherein the driving voltage line comprises a lower driving voltage line and an upper driving voltage line connected to each other, wherein the upper driving voltage line is disposed on a different layer from the source connection electrode, and wherein a repair short portion of the upper driving voltage line overlaps a repair short portion of the source connection electrode.

10. The display device of claim 9, wherein the upper driving voltage line is disposed over the source connection electrode.

11. The display device of claim 9, wherein the repair short portion of the upper driving voltage line and the repair short portion of the source connection electrode are in contact with each other.

12. The display device of claim 9, wherein a source electrode of the main transistor corresponding to the at least one auxiliary transistor is connected to the lower driving voltage line.

13. The display device of claim 12, wherein the lower driving voltage line is disconnected such that lower driving voltage line and the source electrode of the main transistor are separated.

14. The display device of claim 13, wherein the disconnected portion of the lower driving voltage line does not overlap an overlapping portion between the repair short portion of the upper driving voltage line and the repair short portion of the source connection electrode.

15. The display device of claim 1, further comprising:
   a drain connection electrode connected to a drain electrode of the at least one auxiliary transistor; and
   a source/drain connection electrode disposed on a different layer from the drain connection electrode,
   wherein a repair short portion of the source/drain connection electrode overlaps a repair short portion of the drain connection electrode.

16. The display device of claim 15, wherein the source/drain connection electrode is disposed over the drain connection electrode.

17. The display device of claim 15, wherein the repair short portion of the source/drain connection electrode and the repair short portion of the drain connection electrode are in contact with each other.

18. The display device of claim 15, wherein a drain electrode of the main transistor corresponding to the at least one auxiliary transistor is connected to the source/drain connection electrode.

19. The display device of claim 18, wherein the drain connection electrode is disconnected such that source/drain connection electrode and the drain electrode of the main transistor are separated.

20. The display device of claim 19, wherein the disconnected portion of the drain connection electrode does not overlap an overlapping portion between the repair short portion of the source/drain connection electrode and the repair short portion of the drain connection electrode.

21. The display device of claim 1, wherein the at least one auxiliary transistor comprises at least one of a second auxiliary transistor corresponding to the second main transistor or a third auxiliary transistor corresponding to the third main transistor.

22. The display device of claim 21, wherein the pixel comprises a first-first transistor area, a first-second transistor area, a second-first transistor area, a second-second transistor area, a third-first transistor area, and a third-second transistor area disposed in three rows and two columns.

23. The display device of claim 22, wherein the first main transistor is disposed in the first-first transistor area corresponding to a first column of a first row, the second main transistor is disposed in the third-second transistor area corresponding to a second column of a third row, the third main transistor is disposed in the second-second transistor area corresponding to the second column of a second row, the fourth main transistor is disposed in the second-first transistor area corresponding to the first column of the second row, the second auxiliary transistor is disposed in the third-first transistor area corresponding to the first column of the third row, and the third auxiliary transistor is disposed in the first-second transistor area corresponding to the second column of the first row.

24. The display device of claim 22, wherein, in the pixel, the first main transistor is disposed in the first-first transistor area corresponding to a first column of a first row, the second main transistor is disposed in the third-second transistor area corresponding to a second column of a third row, the third main transistor is disposed in the second-second transistor area corresponding to the second column of a second row, the fourth main transistor is disposed in the second-first transistor area corresponding to the first column of the second row, the second auxiliary transistor is disposed in the third-first transistor area corresponding to the first column of the third row, and the third auxiliary transistor is disposed in the first-second transistor area corresponding to the second column of the first row, and
   wherein, in a second pixel disposed adjacent to the pixel, a first main transistor is disposed in a first-second transistor area corresponding to a second column of a first row, a second main transistor is disposed in a third-first transistor area corresponding to a first column of a third row, a third main transistor is disposed in a second-second transistor area corresponding to the second column of a second row, a fourth main transistor is disposed in a second-first transistor area corresponding to the first column of the second row, a second auxiliary transistor is disposed in a third-second transistor area corresponding to the second column of the third row, and a third auxiliary transistor is disposed in a first-first transistor area corresponding to the first column of the first row.

25. The display device of claim 22, wherein the first main transistor is disposed in the third-first transistor area corresponding to the first column of the third row, the second main transistor is disposed in the second-first transistor area corresponding to the first column of the second row, the third main transistor is disposed in the second-second transistor area corresponding to the second column of the second row, the fourth main transistor is disposed in the third-second transistor area corresponding to the second column of the third row, the second auxiliary transistor is disposed in the first-first transistor area corresponding to the first column of the first row, and the third auxiliary transistor is disposed in the first-second transistor area corresponding to the second column of the first row.

26. The display device of claim 22, wherein the first main transistor is disposed in the first-second transistor area corresponding to the second column of the first row, the second main transistor is disposed in the second-second transistor area corresponding to the second column of the second row, the third main transistor is disposed in the second-first transistor area corresponding to the first column of the second row, the fourth main transistor is disposed in the first-first transistor area corresponding to the first column of the first row, the second auxiliary transistor is disposed in the third-second transistor area corresponding to the second column of the third row, and the third auxiliary transistor is disposed in the third-first transistor area corresponding to the first column of the third row.

27. The display device of claim 22, wherein the first main transistor is disposed in the first-first transistor area corresponding to the first column of the first row, the second main transistor is disposed in the first-second transistor area corresponding to the second column of the first row, the third main transistor is disposed in the third-first transistor area corresponding to the first column of the third row, the fourth main transistor is disposed in the third-second transistor area corresponding to the second column of the third row, the second auxiliary transistor is disposed in the second-second transistor area corresponding to the second column of the second row, and the third auxiliary transistor is disposed in the second-first transistor area corresponding to the first column of the second row.

28. The display device of claim 22, further comprising:
a sensing line connected to the pixel; and
a sensing transistor disposed in the pixel circuit, and connected between the sensing line and the gate electrode of the first main transistor.

29. The display device of claim 28, wherein the first main transistor is disposed in the first-first transistor area corresponding to the first column of the first row, the second main transistor is disposed in the third-second transistor area corresponding to the second column of the third row, the third main transistor is disposed in the second-second transistor area corresponding to the second column of the second row, the fourth main transistor is disposed in the second-first transistor area corresponding to the first column of the second row, the second auxiliary transistor is disposed in the third-first transistor area corresponding to the first column of the third row, and the sensing transistor is disposed in the first-second transistor area corresponding to the second column of the first row.

30. The display device of claim 1, further comprising:
a first capacitor connected between the gate electrode of the first main transistor and the anode electrode of the light emitting element; and
a second capacitor connected between the gate electrode of the first main transistor and the source electrode of the first main transistor.

31. A display device comprising:
a pixel comprising a light emitting element and a pixel circuit connected to the light emitting element; and
a signal line connected to the pixel,
wherein the signal line comprises a gate line, an emission line, and a data line,
wherein the pixel circuit comprises:
a first main transistor connected between a driving voltage line and an anode electrode of the light emitting element,
a second main transistor connected between the data line and a gate electrode of the first main transistor,
a third main transistor connected between the driving voltage line and a source electrode of the first main transistor,
a fourth main transistor connected between a drain electrode of the first main transistor and a common voltage line, and
at least one auxiliary transistor disposed adjacent to at least one of the first to fourth main transistors, a gate electrode, a source electrode and a drain electrode of the at least one auxiliary transistor have a floating state before repairing, and wherein, after repairing, the gate electrode, the source electrode and the drain electrode of the at least one auxiliary transistor are connected to conductive lines in which a gate electrode, a source electrode and a drain electrode of at least one of the first to fourth main transistors were previously connected, respectively before repairing;
a first source connection electrode connected to a source electrode of the at least one auxiliary transistor; and
a source extension electrode disposed on a different layer from the first source connection electrode, and connected to the first source connection electrode,
wherein a repair short portion of the source extension electrode overlaps a repair short portion of a second source connection electrode connected to the data line.

32. The display device of claim 31, wherein the source extension electrode is disposed over the first and second source connection electrodes, and is disposed on the same layer as the data line.

33. The display device of claim 31, wherein the repair short portion of the source extension electrode is in contact with the repair short portion of the second source connection electrode.

34. The display device of claim 31, wherein a source electrode of the main transistor corresponding to the at least one auxiliary transistor is connected to the second source connection electrode.

35. The display device of claim 34, wherein the second source connection electrode is disconnected such that the data line and the source electrode of the main transistor are separated.

36. The display device of claim 35, wherein the disconnected portion of the second source connection electrode does not overlap an overlapping portion between the repair short portion of the source extension electrode and the repair short portion of the second source connection electrode.

37. A display device comprising:
a pixel comprising a light emitting element and a pixel circuit connected to the light emitting element; and
a signal line connected to the pixel,
wherein the signal line comprises a gate line, an emission line, and a data line,
wherein the pixel circuit comprises:
a first main transistor connected between a driving voltage line and an anode electrode of the light emitting element,
a second main transistor connected between the data line and a gate electrode of the first main transistor,
a third main transistor connected between the driving voltage line and a source electrode of the first main transistor,
a fourth main transistor connected between a drain electrode of the first main transistor and a common voltage line, and
at least one auxiliary transistor disposed adjacent to at least one of the first to fourth main transistors, a gate electrode, a source electrode and a drain electrode of the at least one auxiliary transistor have a floating state before repairing, and
wherein, after repairing, the gate electrode, the source electrode and the drain electrode of the at least one auxiliary transistor are connected to conductive lines in which a gate electrode, a source electrode and a drain electrode of at least one of the first to fourth main transistors were previously connected, respectively before repairing;

a drain connection electrode connected to a drain electrode of the at least one auxiliary transistor; and a gate/drain connection electrode disposed on a different layer from the drain connection electrode, wherein a repair short portion of the gate/drain connection electrode overlaps a repair short portion of the drain connection electrode.

38. The display device of claim 37, wherein the gate/drain connection electrode is disposed over the drain connection electrode.

39. The display device of claim 37, wherein the repair short portion of the gate/drain connection electrode and the repair short portion of the drain connection electrode are in contact with each other.

40. The display device of claim 37, wherein a drain electrode of the main transistor corresponding to the at least one auxiliary transistor is connected to the gate/drain connection electrode.

41. The display device of claim 40, wherein the drain connection electrode is disconnected such that the gate/drain connection electrode and the drain electrode of the main transistor are separated.

42. The display device of claim 41, wherein the disconnected portion of the drain connection electrode does not overlap an overlapping portion between the repair short portion of the gate/drain connection electrode and the repair short portion of the drain connection electrode.

43. The display device of claim 37, further comprising:

a gate connection electrode connected to a gate electrode of the at least one auxiliary transistor; and a gate extension electrode disposed on a different layer from the gate connection electrode and connected to the emission line, wherein a repair short portion of the gate extension electrode overlaps a repair short portion of the gate connection electrode.

44. The display device of claim 43, wherein the gate extension electrode is disposed over the gate connection electrode and the gate line.

45. The display device of claim 43, wherein the repair short portion of the gate extension electrode and the repair short portion of the gate connection electrode are in contact with each other.

46. The display device of claim 43, wherein a gate electrode of the main transistor corresponding to the at least one auxiliary transistor is connected to the emission line.

* * * * *